(12) United States Patent
Sugisaki

(10) Patent No.: US 11,729,975 B2
(45) Date of Patent: Aug. 15, 2023

(54) SEMICONDUCTOR MEMORY

(71) Applicant: KIOXIA CORPORATION, Tokyo (JP)

(72) Inventor: Tsuyoshi Sugisaki, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 129 days.

(21) Appl. No.: 17/220,182

(22) Filed: Apr. 1, 2021

(65) Prior Publication Data

US 2021/0217774 A1    Jul. 15, 2021

Related U.S. Application Data

(63) Continuation of application No. 16/109,392, filed on Aug. 22, 2018, now Pat. No. 10,998,332.

(30) Foreign Application Priority Data

Mar. 15, 2018  (JP) .................................. 2018-048012

(51) Int. Cl.

| | | |
|---|---|---|
| H01L 27/115 | (2017.01) |
| H10B 43/27 | (2023.01) |
| G11C 7/18 | (2006.01) |
| G11C 8/14 | (2006.01) |
| H10B 43/35 | (2023.01) |

(52) U.S. Cl.
CPC ............... *H10B 43/27* (2023.02); *G11C 7/18* (2013.01); *G11C 8/14* (2013.01); *H10B 43/35* (2023.02)

(58) Field of Classification Search
CPC ........................ H01L 27/11582; H01L 27/1157
See application file for complete search history.

(56) References Cited

U.S. PATENT DOCUMENTS

| | | | |
|---|---|---|---|
| 8,169,016 B2 | 5/2012 | Higashi | |
| 8,378,406 B2 | 2/2013 | Katsumata et al. | |
| 9,679,906 B2 | 6/2017 | Lu et al. | |
| 2016/0293622 A1* | 10/2016 | Jeong | ................ H01L 27/11565 |
| 2017/0047334 A1 | 2/2017 | Lu et al. | |

(Continued)

FOREIGN PATENT DOCUMENTS

| | | |
|---|---|---|
| CN | 106992179 A | 7/2017 |
| JP | 2011-054899 A | 3/2011 |

(Continued)

*Primary Examiner* — Moazzam Hossain
*Assistant Examiner* — Hajar Kolahdouzan
(74) *Attorney, Agent, or Firm* — Kim & Stewart LLP

(57) ABSTRACT

A semiconductor memory includes a stack section comprising a first area including a plurality of first conductors and a plurality of first insulators alternately stacked in a first direction and memory cells, and a second area including respective end portions of the plurality of stacked first conductors and the plurality of stacked first insulators, a plurality of contact plugs respectively reaching the plurality of first conductors in the second area, first and second supporting portions configured respectively to pass through the stack section in the first direction and arranged in a second direction, which crosses the first direction, in the second area, and a layer between respective adjacent first insulators, among the plurality of first insulators that are stacked, between the first supporting portion and the second supporting portion, wherein the layer is made of a material that is different from that of the first conductors.

12 Claims, 22 Drawing Sheets

(56) References Cited

U.S. PATENT DOCUMENTS

| | | |
|---|---|---|
| 2017/0092733 A1 | 3/2017 | Makala et al. |
| 2017/0213840 A1 | 7/2017 | Sudo et al. |
| 2018/0233185 A1 | 8/2018 | Futatsuyama |
| 2019/0043876 A1 | 2/2019 | van Schravendijk et al. |
| 2019/0259776 A1 | 8/2019 | Kim et al. |

FOREIGN PATENT DOCUMENTS

| | | |
|---|---|---|
| TW | 201123425 A | 7/2011 |
| TW | 201738965 A | 11/2017 |

\* cited by examiner

SEMICONDUCTOR MEMORY

CROSS-REFERENCE TO RELATED APPLICATIONS

This application is a continuation of U.S. patent application Ser. No. 16/109,392, filed on Aug. 22, 2018, which is based upon and claims the benefit of priority from Japanese Patent Application No. 2018-048012, filed on Mar. 15, 2018, the entire contents of each of which are incorporated herein by reference.

FIELD

Embodiments described herein relate generally to a semiconductor memory.

BACKGROUND

A known NAND type flash memory includes memory cells stacked three-dimensionally.

DETAILED DESCRIPTION

Figure 1:
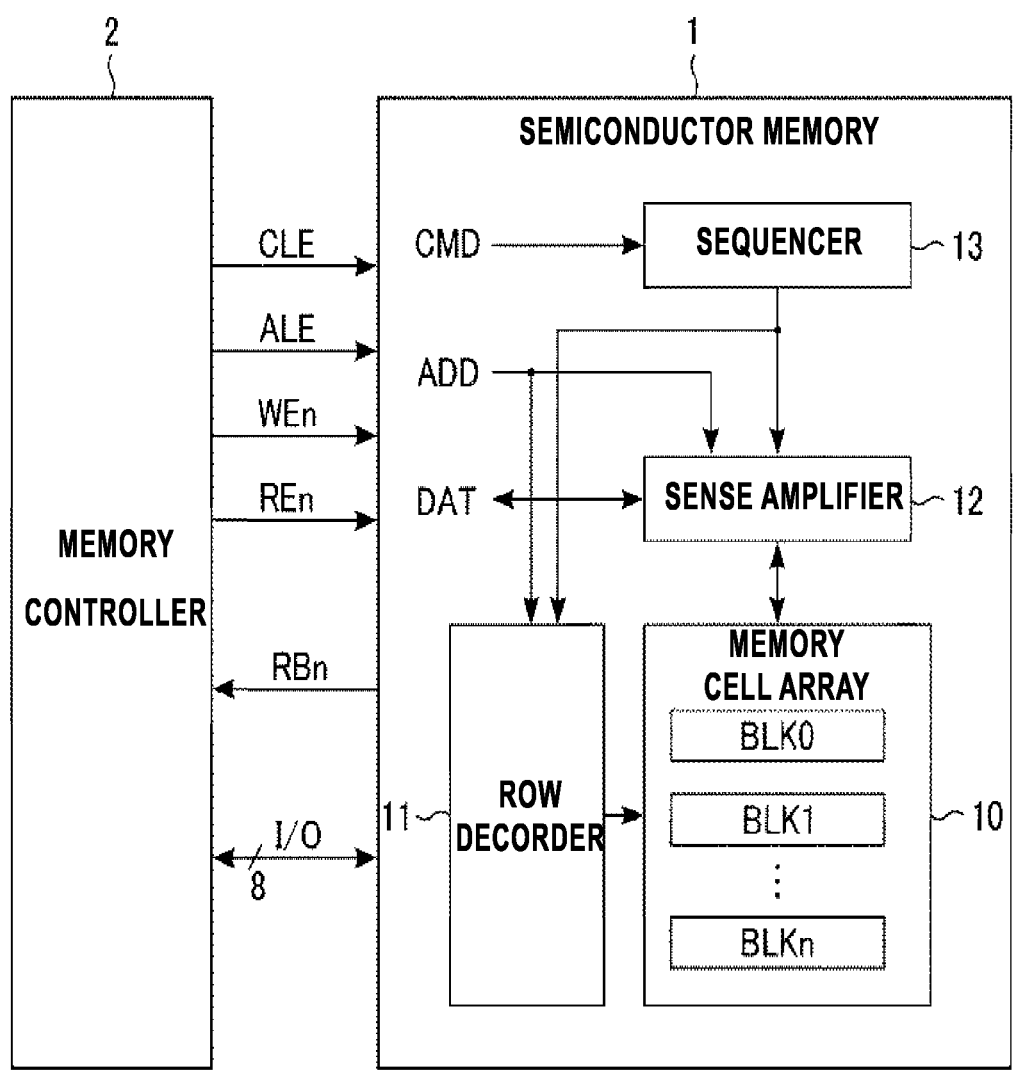
FIG. 1 is a block diagram illustrating an example of a configuration of a semiconductor memory according to an embodiment.

An embodiment improves the yield of a semiconductor memory.

In general, according to one embodiment, a semiconductor memory includes a stack section comprising a first area including a plurality of first conductors and a plurality of first insulators alternately stacked in a first direction and memory cells, and a second area including respective end portions of the plurality of stacked first conductors and the plurality of stacked first insulators, a plurality of contact plugs respectively reaching the plurality of first conductors in the second area, first and second supporting portions configured respectively to pass through the stack section in the first direction and arranged in a second direction, which crosses the first direction, in the second area, and a layer between respective adjacent first insulators, among the plurality of first insulators that are stacked, between the first supporting portion and the second supporting portion, wherein the layer is made of a material that is different from that of the first conductors.

Hereinafter, embodiments will be described with reference to the drawings. The drawings are schematic. The embodiments exemplify an apparatus or a method for embodying the technical idea of the disclosure. In addition, in the following description, the same reference numerals will be attached to constituent elements having substantially the same functions and configurations. The numerals after the characters making up the reference numerals are referred to by reference numerals including the same characters, and are also used to distinguish between elements having the same structure. When there is no need to distinguish the elements denoted by reference signs containing the same characters from each other, these elements are referred to by reference numerals containing only the same characters.

[1] Embodiment

Hereinafter, a semiconductor memory 1 according to an embodiment will be described.

[1-1] Configuration

[1-1-1] Configuration of Semiconductor Memory 1

FIG. 1 illustrates an example of a configuration of the semiconductor memory 1 according to an embodiment. The semiconductor memory 1 is a NAND type flash memory capable of storing data in a nonvolatile manner. As illustrated in FIG. 1, the semiconductor memory 1 includes, for example, a memory cell array 10, a row decoder 11, a sense amplifier 12, and a sequencer 13.

The memory cell array 10 includes a plurality of blocks BLK0 to BLKn (n is an integer of 1 or more). The block BLK is a group of nonvolatile memory cells, and becomes, for example, an erasure unit of data. The memory cell array 10 is provided with a plurality of bit lines and a plurality of word lines, and each memory cell is associated with one bit line and one word line. A detailed configuration of the memory cell array 10 will be described later.

The row decoder 11 selects one block BLK based on address information ADD received from an external memory controller 2. Then, the row decoder 11 applies a desired voltage to each of a selected word line and an unselected word line, for example.

The sense amplifier 12 applies a desired voltage to each bit line according to write data DAT received from the memory controller 2. In addition, the sense amplifier 12 determines data stored in the memory cell based on the voltage of the bit line, and transmits determined read data DAT to the memory controller 2.

The sequencer 13 controls an overall operation of the semiconductor memory 1 based on a command CMD received from the memory controller 2. Communication between the semiconductor memory 1 and the memory controller 2 supports, for example, the NAND interface standard. For example, the memory controller 2 transmits a command latch enable signal CLE, an address latch enable signal ALE, a write enable signal WEn, and a read enable signal REn, receives a ready busy signal RBn, and transmits and receives an input/output signal I/O.

The signal CLE is a signal that notifies the semiconductor memory 1 that the received signal I/O is the command CMD. The signal ALE is a signal that notifies the semiconductor memory 1 that the received signal I/O is the address information ADD. The signal WEn is a signal that instructs the semiconductor memory 1 to input the signal I/O. The signal REn is a signal that instructs the semiconductor memory 1 to output the signal I/O. The signal RBn is a signal that notifies the memory controller 2 whether the semiconductor memory 1 is in a ready state where it accepts a command from the memory controller 2 or is in a busy state where it accepts no command. The signal I/O is, for example, an 8-bit signal, and may include, for example, the command CMD, the address information ADD, and the data DAT.

The semiconductor memory 1 and the memory controller 2 described above may be combined to configure a single semiconductor device. Examples of such a semiconductor device may include a memory card, such as an SD™ card or a solid state drive (SSD).

[1-1-2] Circuit Configuration of Memory Cell Array 10

Figure 2:
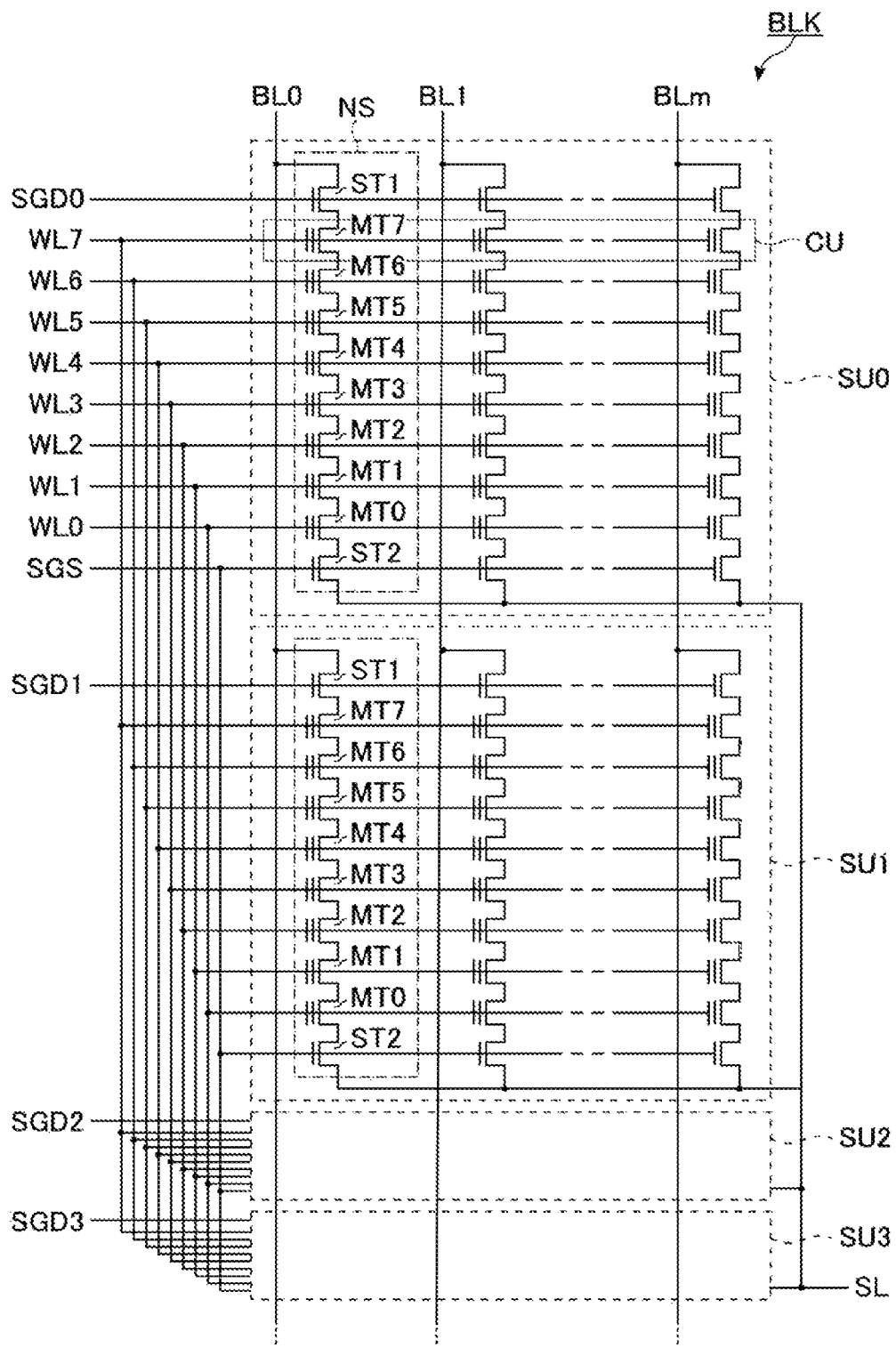
FIG. 2 is a circuit diagram illustrating an example of a circuit configuration of a memory cell array provided in the semiconductor memory according to the embodiment.

FIG. 2 is a view illustrating an example of a circuit configuration of the memory cell array 10 according to the embodiment, in which one extracted block BLK is illustrated. As illustrated in FIG. 2, the block BLK includes, for example, four string units SU (SU0 to SU3).

Each string unit SU includes a plurality of NAND strings NS. The plurality of NAND strings NS are associated with bit lines BL0 to BLm (m is an integer of 1 or more), respectively. In addition, each NAND string NS includes, for example, memory cell transistors MT0 to MT7 and select transistors ST1 and ST2.

The memory cell transistor MT includes a control gate and a charge storage layer, and stores data in a nonvolatile manner. Each of the select transistors ST1 and ST2 is used to select the string unit SU during various operations.

In each NAND string NS, a drain of the select transistor ST1 is connected to a corresponding bit line BL. The memory cell transistors MT0 to MT7 are connected in series between a source of the select transistor ST1 and a drain of the select transistor ST2. A source of the select transistor ST2 is connected to a source line SL.

In the same block BLK, control gates of the respective memory cell transistors MT0 to MT7 are commonly connected to word lines WL0 to WL7, respectively. Gates of the select transistors ST1, which are provided in the respective string units SU0 to SU3, are commonly connected to select gate lines SGD0 to SGD3, respectively. Gates of the select transistors ST2 are commonly connected to a select gate line SGS.

Different column addresses are allocated to the respective bit lines BL0 to BLm, and each bit line BL commonly interconnects the select transistors ST1 of corresponding NAND strings NS between a plurality of blocks BLK. The respective word lines WL0 to WL7 are provided for each block BLK. The source line SL is shared between the plurality of blocks BLK.

A plurality of memory cell transistors MT, which are connected to a common word line WL in one string unit SU, is referred to as a cell unit CU, for example. The cell unit CU is changed in storage capacity according to the number of bits of data stored in the memory cell transistors MT. For example, the cell unit CU stores 1-page data when each of the plurality of memory cell transistors MT in the cell unit CU stores 1-bit data, and stores 2-page data when each of the plurality of memory cell transistors MT in the cell unit CU stores 2-bit data.

[1-1-3] Structure of Memory Cell Array 10

Figure 3:
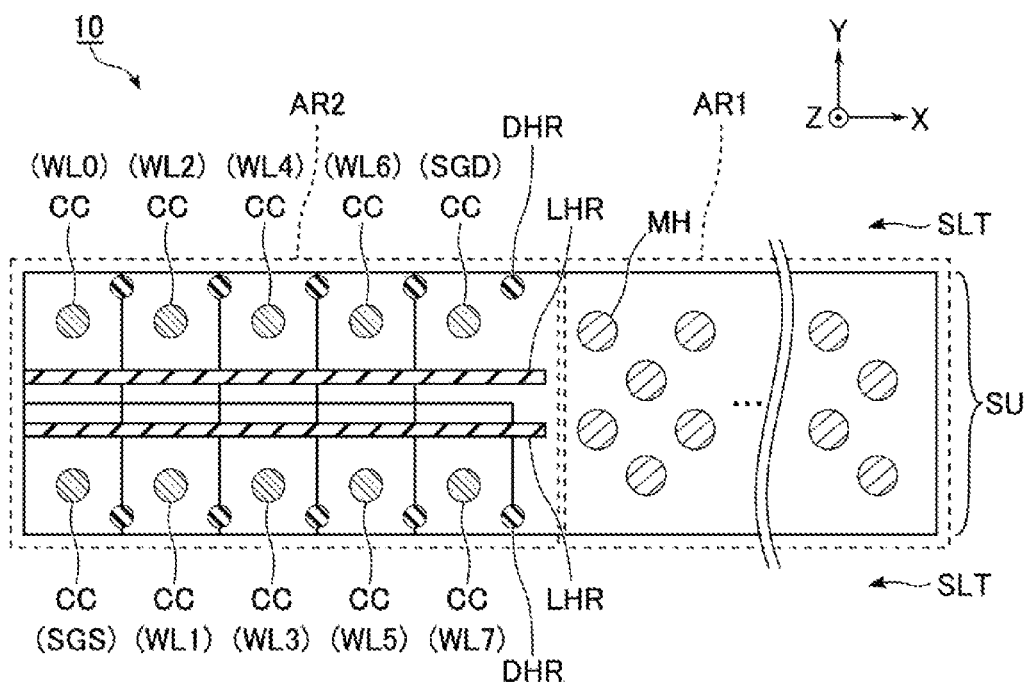
FIG. 3 is a plan view illustrating an example of a planar layout of the memory cell array provided in the semiconductor memory according to the embodiment.

FIG. 3 illustrates an example of a planar layout in a cell area AR1 and a lead-out area AR2 of the semiconductor memory 1 according to a first embodiment, and each of the X axis, the Y axis, and the Z axis. The X axis corresponds to the direction in which the word line WL extends, the Y axis corresponds to the direction in which the bit line BL extends, and the Z axis corresponds to the direction orthogonal to the substrate surface.

As illustrated in FIG. 3, the memory cell array 10 is provided with a plurality of slits SLT, for example. For example, the plurality of slits SLT are provided to extend in the X direction, and are arranged in the Y direction, respectively.

A structure between adjacent slits SLT corresponds to, for example, one string unit SU. The number of string units SU, provided in the structure between the adjacent slits SLT, is not limited to one, and may be designed in any number.

In addition, the memory cell array 10 includes a cell area AR1 and a lead-out area AR2. In other words, the structure between the adjacent slits SLT includes the cell area AR1 and the lead-out area AR2.

The cell area AR1 includes a plurality of memory cells, and is an area that substantially holds data. The lead-out area AR2 is an area that is used for connection between wires provided in the string unit SU and the row decoder 11. Hereinafter, a detailed configuration of the memory cell array 10 in each of the cell area AR1 and the lead-out area AR2 will be sequentially described.

(Cell Area AR1)

As illustrated in FIG. 3, in the cell area AR1 of the memory cell array 10, the string unit SU includes a plurality of memory pillars MH. The plurality of memory pillars MH are arranged in a staggered manner in the X direction, for example. Each of the plurality of memory pillars MH functions as, for example, one NAND string NS.

Figure 4:
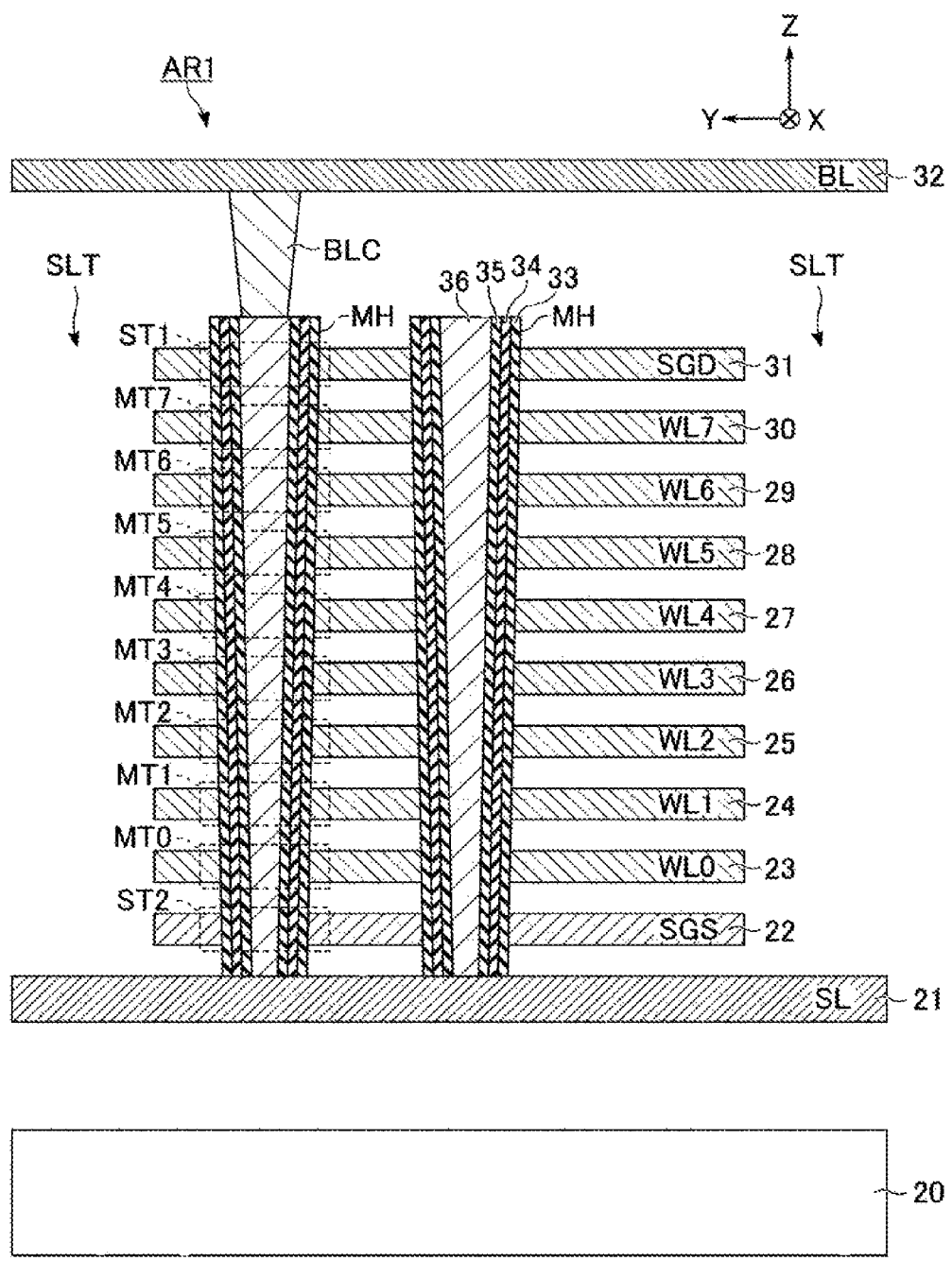
FIG. 4 is a cross-sectional view illustrating an example of a cross-sectional structure of the memory cell array provided in the semiconductor memory according to the embodiment.

FIG. 4 is a view of an example of a cross-sectional structure in the cell area AR1 of the memory cell array 10 according to the embodiment. This illustrates a cross section of the memory cell array 10 in the X direction and each of the X axis, the Y axis, and the Z axis. In addition, in the drawings used in the following description, illustration of an interlayer insulating film is appropriately omitted.

As illustrated in FIG. 4, in the cell region AR1, the memory cell array 10 includes a semiconductor substrate 20, conductors 21 to 32, the memory pillars MH, and a contact plug BLC.

The conductor 21 is provided above the semiconductor substrate 20 with an insulating film interposed therebetween. The conductor 21 is formed in the shape of a plate that is parallel to the XY plane, and functions as the source line SL. On the conductor 21, the plurality of slits SLT are arranged in the Y direction so as to be parallel to the XZ plane. A structure, which is on the conductor 21 and is also between adjacent slits SLT, corresponds to, for example, one string unit SU.

Specifically, the conductors 22 to 31 are provided on the conductor 21 and between the adjacent slits SLT in sequence from the semiconductor substrate 20 side. Among these conductors, conductors that are adjacent to each other in the Z direction are stacked with an interlayer insulating film (not illustrated) interposed therebetween. Each of the conductors 22 to 31 is formed in the shape of a plate that is parallel to the XY plane.

For example, the conductor 22 functions as a select gate line SGS. The conductors 23 to 30 function as word lines WL0 to WL7, respectively. The conductor 31 functions as a select gate line SGD.

Each memory pillar MH is provided through each of the conductors 22 to 31 and reach the upper surface of the conductor 21 from the upper surface of the conductor 31. In addition, the memory pillar MH includes, for example, a block insulating film 33, an insulating film 34, a tunnel oxide film 35, and a conductive semiconductor material 36.

The block insulating film 33 is provided on the inner wall of a memory hole, which forms the memory pillar MH. The insulating film 34 is provided on the inner wall of the block insulating film 33. The insulating film 34 functions as a charge storage layer of the memory cell transistor MT. The tunnel oxide film 35 is provided on the inner wall of the insulating film 34. The semiconductor material 36 is provided on the inner wall of the tunnel oxide film 35, and a current path of the NAND string NS is formed in the semiconductor material 36. In addition, different materials may be formed on the inner wall of the semiconductor material 36.

For example, the portion, in which the memory pillar MH and the conductor 22 cross each other, functions as the select transistor ST2. The portions, in which the memory pillar MH and the respective conductors 23 to 30 cross each other, function as the memory cell transistors MT0 to MT7, respectively. The portion, in which the memory pillar MH and the conductor 31 cross each other, functions as the select transistor ST1.

The conductor 32 is provided above the upper surface of the memory pillar MH with an interlayer insulating film (not illustrated) interposed therebetween. The conductor 32 is formed in the shape of a line that extends in the Y direction, and functions as the bit line BL. A plurality of conductors 32 are arranged in the X direction (not illustrated). The conductor 32 is electrically connected to one corresponding memory pillar MH for each string unit SU.

Specifically, the conductive contact plug BLC is provided on the semiconductor material 36 in the memory pillar MH, and the conductor 32 is provided on the contact plug BLC. Thereby, the semiconductor material 36 in the memory pillar MH is electrically connected to one corresponding conductor 32 via the contact plug BLC. In addition, the memory pillar MH and the bit line BL may be electrically connected to each other via a plurality of contact plugs and wires.

(Lead-Out Area AR2)

Returning back to FIG. 3, in the lead-out area AR2 of the memory cell array 10, the end portions of the conductors, which correspond respectively to the word lines WL0 to WL7 and the select gate lines SGS and SGD, are provided in, for example, the shape of two rows of steps. In addition, in the lead-out area AR2 of the memory cell array 10, the string unit SU includes a plurality of contact plugs CC, a plurality of supporting portions LHR, and a plurality of supporting columns DHR.

The plurality of contact plugs CC are provided to correspond to, for example, the word lines WL0 to WL7 and the select gate lines SGD and SGS, respectively. Each of the word lines WL0 to WL7 and the select gate lines SGD and SGS is electrically connected to the row decoder 11 via, for example, one contact plug CC.

The supporting portion LHR is formed, for example, in the shape of a plate that is parallel to the XZ plane, and is provided so as to traverse all of stepped portions in the X direction, for example, in the lead-out area AR2. In other words, for example, the supporting portion LHR extends from one side in the X direction to the vicinity of the cell area AR1 so as to be aligned with the end portion of a structure corresponding to the string unit SU on the other side in the X direction, or is provided so as to extend closer to the other side than the corresponding structure.

At least two supporting portions LHR are provided in the lead-out area AR2, and are arranged in the Y direction, for example. The end portions of the respective supporting portions LHR in the X direction may or may not be aligned with each other. For example, a stepped portion in the Y direction is provided with no contact plug CC between adjacent supporting portions LHR.

The supporting column DHR is formed in, for example, a columnar shape. The disclosure is not limited thereto, and the cross-sectional shape of the supporting column DHR in the XY plane may be an elliptical shape. The supporting column DHR is disposed around the contact plug CC, for example, and is provided closer to the slit SLT than the contact plug CC in the Y direction.

In other words, the distance in the Y direction between one of the supporting columns DHR provided around a certain contact plug CC and the supporting portion LHR is larger than the distance in the Y direction between the contact plug CC and the supporting portion LHR. Then, at least one supporting column DHR is disposed so as to overlap each of the conductors provided in the shape of two rows of steps.

Each of the supporting portions LHR and the supporting columns DHR reduces deformation of the structure forming the string unit SU in a process of manufacturing the semiconductor memory 1. As the supporting portion LHR and the supporting column DHR, for example, silicon oxide $SiO_2$ or silicon nitride SiN is used. In addition, for example, each of the supporting portions LHR and the supporting columns DHR may be a structure in which silicon oxide $SiO_2$ is formed around silicon nitride SiN as a core, or may be a structure using a plurality of materials.

Figure 5:
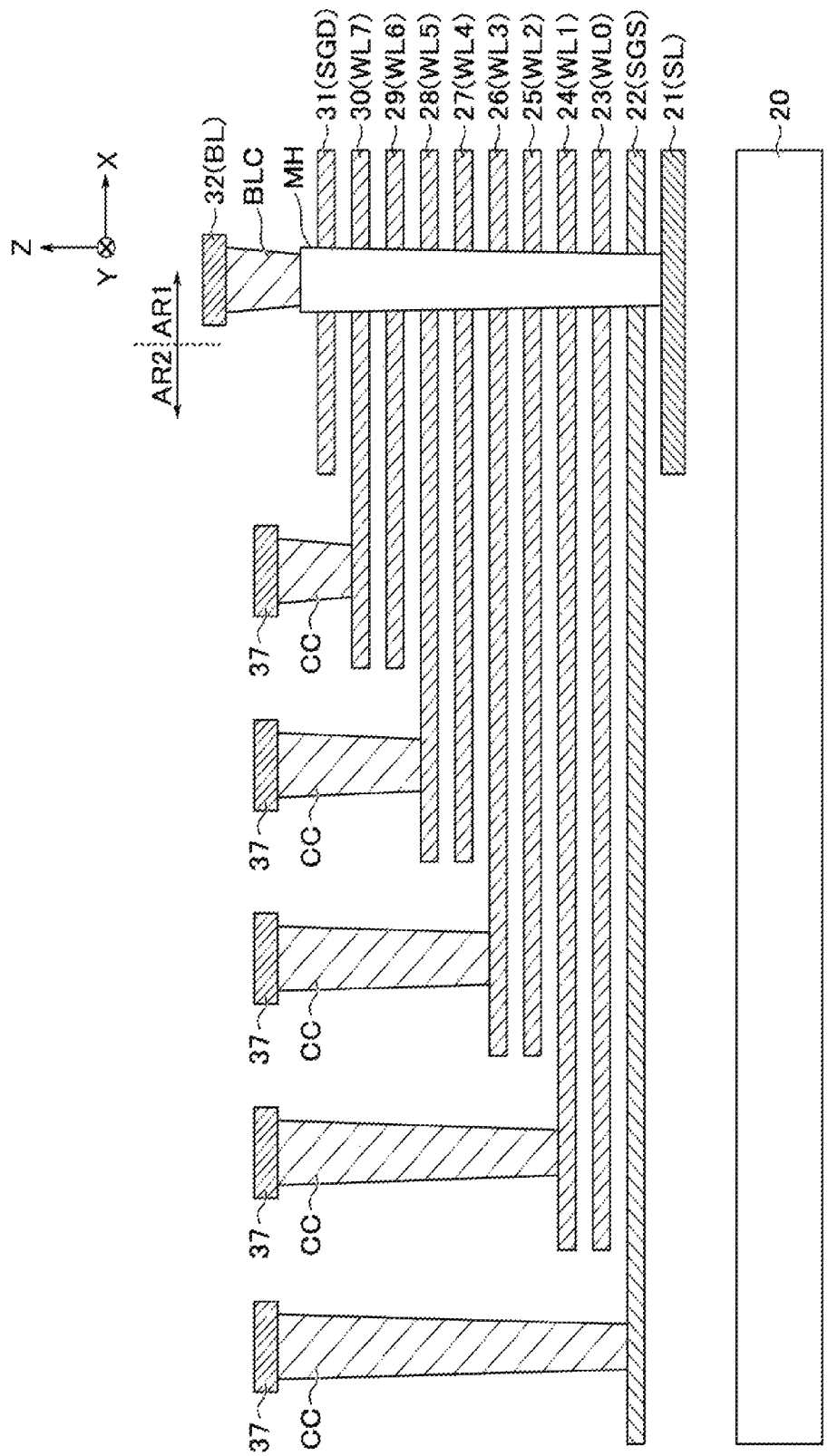
FIG. 5 is a cross-sectional view illustrating an example of a cross-sectional structure of the memory cell array provided in the semiconductor memory according to the embodiment.

FIG. 5 is a view of an example of a cross-sectional structure in the lead-out area AR2 of the memory cell array 10 according to the embodiment, and illustrates a cross section of the memory cell array 10 in the X direction including the contact plugs CC, which correspond to the select gate line SGS and the word lines WL1, WL3, WL5, and WL7, respectively. In addition, FIG. 5 illustrates a portion of the cross-sectional structure of the memory cell array 10 in the cell area AR1, and illustration of a detailed structure of the memory pillar MH is omitted.

As illustrated in FIG. 5, the conductors 22 to 31 are provided in a stepped shape in the lead-out area AR2. In other words, two adjacent conductors, among the conductors 22 to 31, have a portion in which they do not overlap each other in the XY plane.

In the lead-out area AR2, the memory cell array 10 includes a plurality of conductors 37 and a plurality of contact plugs CC. The conductors 37 are wires for connecting various wires to the row decoder 11. For example, the conductor 37 corresponding to the select gate line SGS and the conductor 22 are connected to each other via the contact plug CC, and the conductor 37 corresponding to the word line WL1 and the conductor 24 are connected to each other via the contact plug CC. Similarly, the other conductors 37 are connected to the corresponding conductors via the contact plugs CC.

Figure 6:
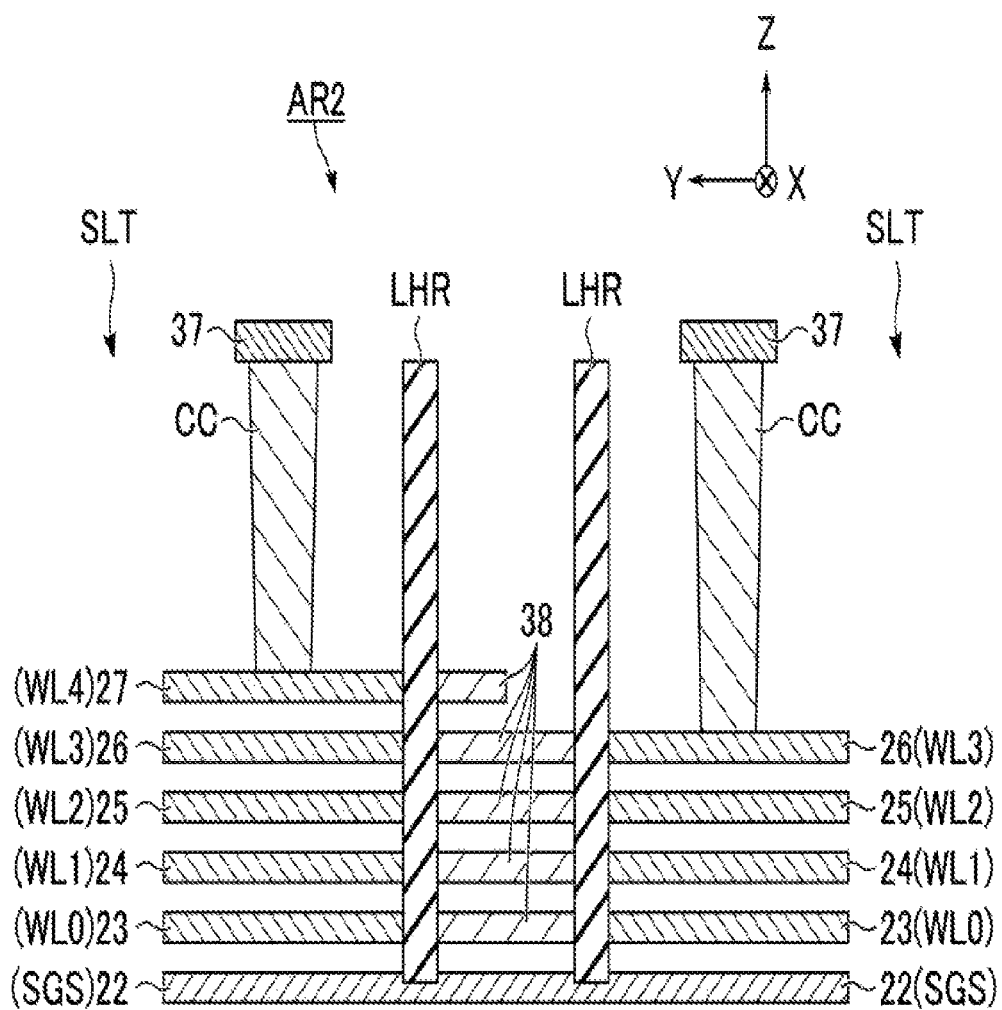
FIG. 6 is a cross-sectional view illustrating an example of a cross-sectional structure of the memory cell array provided in the semiconductor memory according to the embodiment.

FIG. 6 is a view of an example of a cross-sectional structure in the lead-out area AR2 of the memory cell array 10 according to the embodiment, and illustrates a cross section of the memory cell array 10 in the Y direction including the contact plugs CC, which correspond respectively to the word lines WL3 and WL4 illustrated in FIG. 3.

As illustrated in FIG. 6, for example, the conductor 37 corresponding to the word line WL3 and the conductor 26 are connected to each other via the contact plug CC, and the conductor 37 corresponding to the word line WL4 and the conductor 27 are connected to each other via the contact plug CC. Then, two supporting portions LHR are provided between these contact plugs CC.

The supporting portion LHR is provided, for example, from the layer including the upper surface of the contact plug CC to the layer in which the conductor 22 is provided. That is, the supporting portion LHR passes through the conductors 23 to 31 provided above the conductor 22 assuming that it includes an area (not illustrated). That is, an insulator is formed in the area, through which the supporting portion LHR passes.

A replacement material 38 is provided in the layer, in which the conductor 23 is provided, between adjacent supporting portions LHR. The replacement material 38 is a material that is used to form the conductors 23 to 30, which function as, for example, the word lines WL, in a process of manufacturing the semiconductor memory 1 to be described later.

Similarly, the replacement material 38 is provided in the layer, in which each of the conductors 24 to 31 is provided, between the adjacent supporting portions LHR assuming that it includes an area (not illustrated). In other words, a plurality of replacement materials 38 are stacked, with an interlayer insulating film interposed therebetween, between the adjacent supporting portions LHR in the lead-out area AR2.

In addition, the range in which the supporting portion LHR is provided is not limited to the configuration described above. For example, the supporting portion LHR may be provided at least between the conductor 22 and the conductor 31, or may pass through the conductor 22. The supporting portion LHR may be provided so as to extend from the upper surface of the conductor 31 through the conductors 22 to 31 and reach the semiconductor substrate 20, or may be provided so as to reach another material provided between the semiconductor substrate 20 and the conductor 22.

The detailed cross-sectional structure of the supporting portion LHR has been described above. The supporting column DHR also has a similar cross-sectional structure, for example. That is, for example, the supporting column DHR passes through the conductors 23 to 31 provided above the conductor 22, and an insulator is formed in the area, through which the supporting column DHR has passed.

[1-2] Manufacturing Method

FIGS. 7 to 13 are views each illustrating an example of a process of manufacturing the semiconductor memory 1 according to the embodiment, and illustrate a cross-sectional structure of the memory cell array 10 in manufacturing process steps. In addition, FIGS. 7 to 13 illustrate an extracted cross section of the memory cell array 10 in the Y direction in which the contact plugs CC, which correspond respectively to the word lines WL3 and WL4, the supporting portions LHR, and the supporting columns DHR, are formed. Hereinafter described are processes from the stacking of a replacement material and an insulator for forming the word lines WL, for example, to the formation of the word lines WL.

Figure 7:
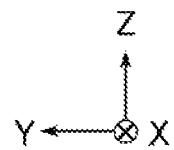
FIG. 7 is a cross-sectional view of the memory cell array illustrating an example of a process of manufacturing the semiconductor memory according to the embodiment.
Figure 7:
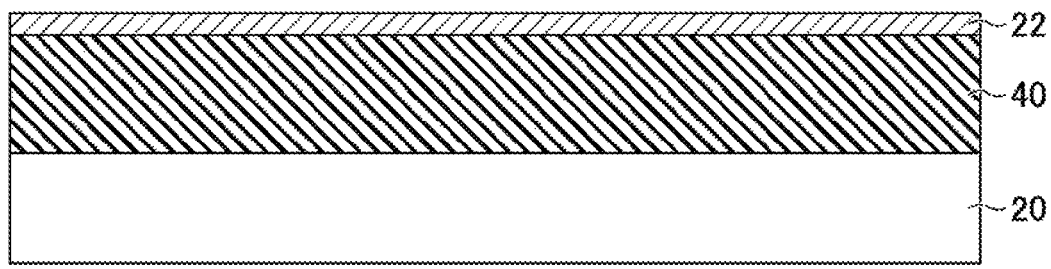

Each manufacturing process to be described later starts from a structure of the semiconductor memory 1 exemplified in FIG. 7, for example. As illustrated in FIG. 7, conductor 22 is formed on the conductor 21 (not shown) with an insulator interposed there between (not shown). This is formed on the semiconductor substrate 20 with an insulator 40 interposed therebetween. For example, a control circuit of the semiconductor memory 1 may be formed between the semiconductor substrate 20 and the conductor 21 (not illustrated).

Figure 8:
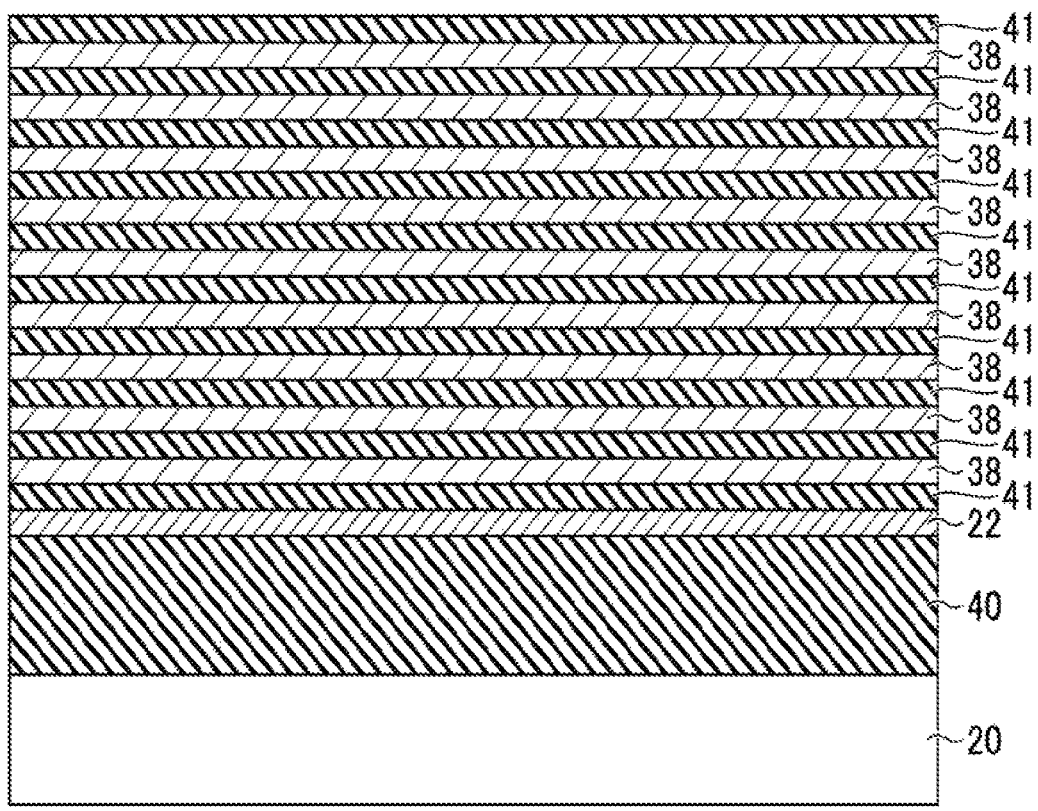
FIG. 8 is a cross-sectional view of the memory cell array illustrating an example of a process of manufacturing the semiconductor memory according to the embodiment.

Then, as illustrated in FIG. 8, insulators 41 and replacement materials 38 are alternately stacked on the conductor 22. As the replacement material 38, for example, a nitride film such as, for example, silicon nitride SiN is used, and as the insulator 41, for example, an oxide film such as, for example, silicon oxide $SiO_2$ is used. The number of layers, in which the replacement material 38 is formed, corresponds to, for example, the number of word lines WL and select gate line SGD, which correspond to the memory pillars MH. The respective replacement materials 38 sequentially correspond to the word lines WL0 to WL7 and the select gate line SGD from the lower layer. The layer thickness of the insulator 41 on the uppermost replacement material 38 is greater than the layer thickness of the other insulators 41, for example.

Figure 9:
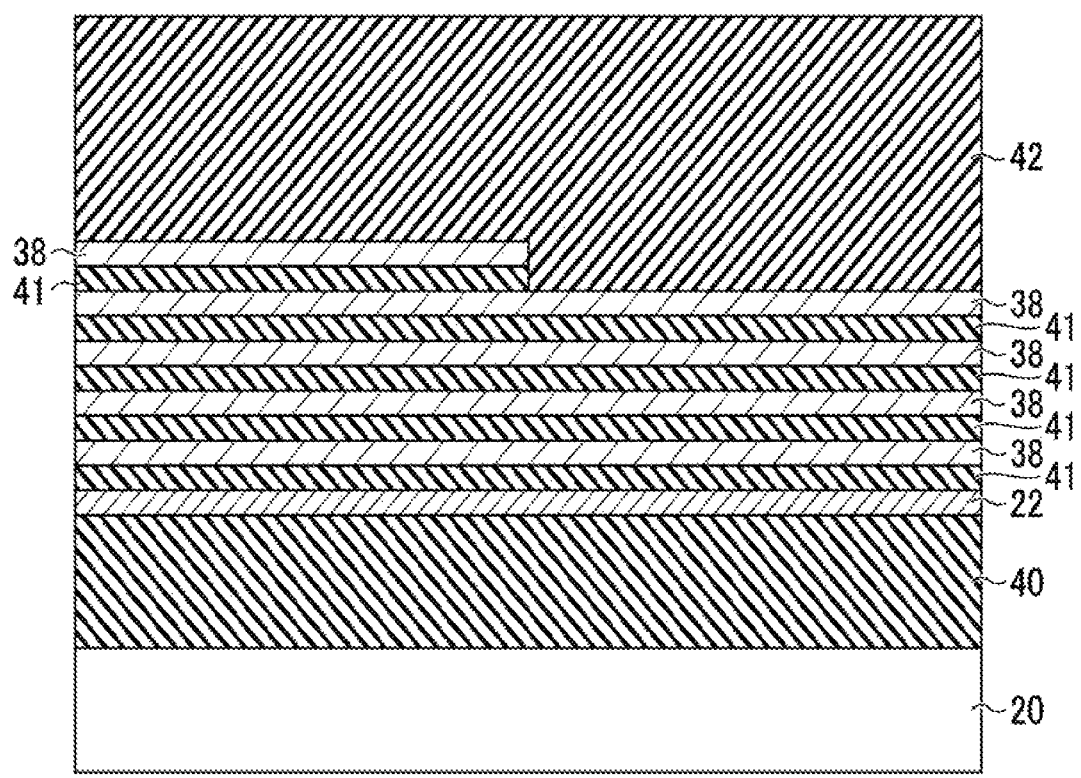
FIG. 9 is a cross-sectional view of the memory cell array illustrating an example of a process of manufacturing the semiconductor memory according to the embodiment.

Next, as illustrated in FIG. 9, a stepped portion is formed in the lead-out area AR2 through, for example, photolithography and etching. In other words, two adjacent replacement materials 38, among the plurality of replacement materials 38, are formed so as to have a portion in which they do not overlap each other in the XY plane. After the stepped portion is formed, an insulator 42 is formed and flattened by chemical mechanical polishing (CMP), for example.

Figure 10:
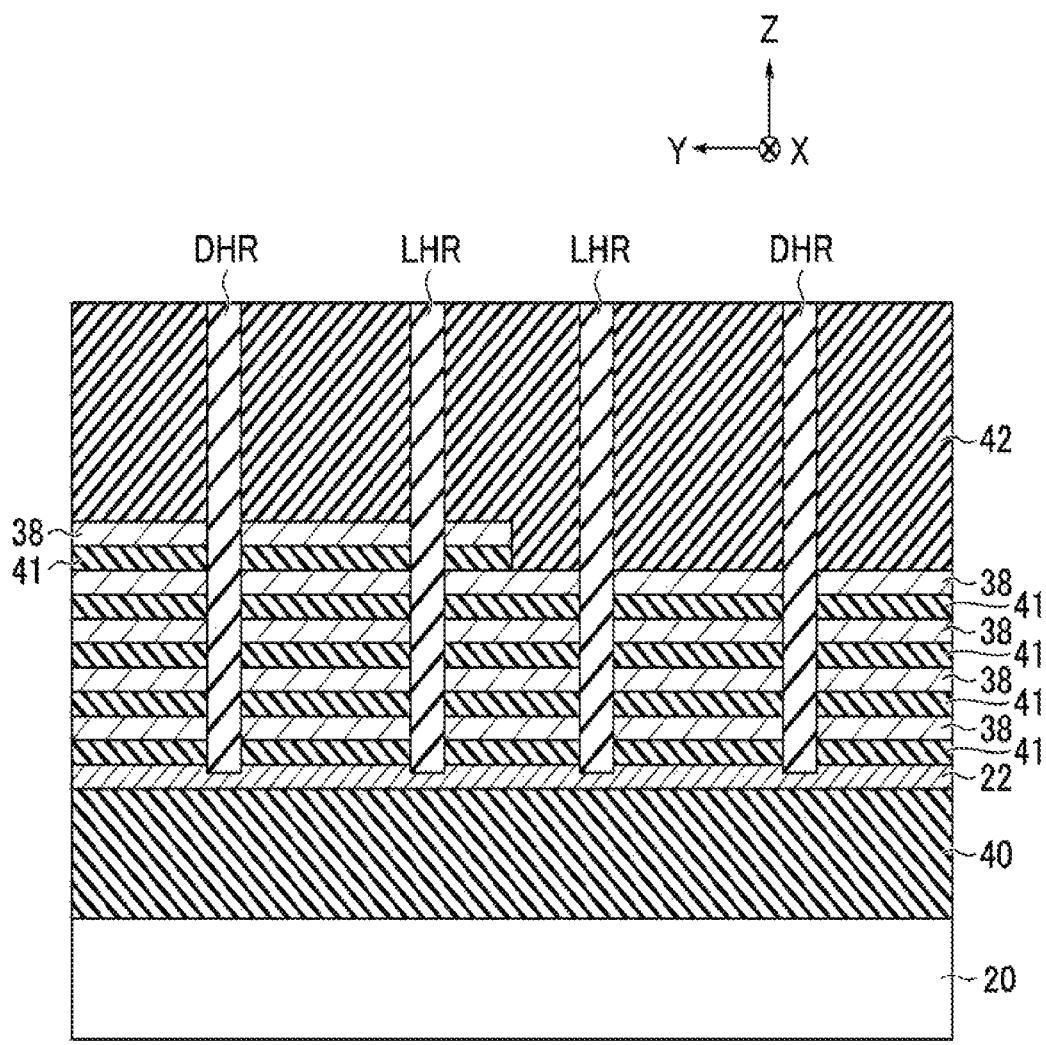
FIG. 10 is a cross-sectional view of the memory cell array illustrating an example of a process of manufacturing the semiconductor memory according to the embodiment.

Then, after forming the memory pillars MH in an area (not illustrated), the supporting portions LHR and the supporting columns DHR are formed, as illustrated in FIG. 10. Specifically, holes for the provision of the supporting portions LHR and the supporting columns DHR are formed by lithography and anisotropic etching such as, for example, reactive ion etching (RIE), and insulators that function as the supporting portions LHR and the supporting columns DHR are formed in the holes.

Figure 11:
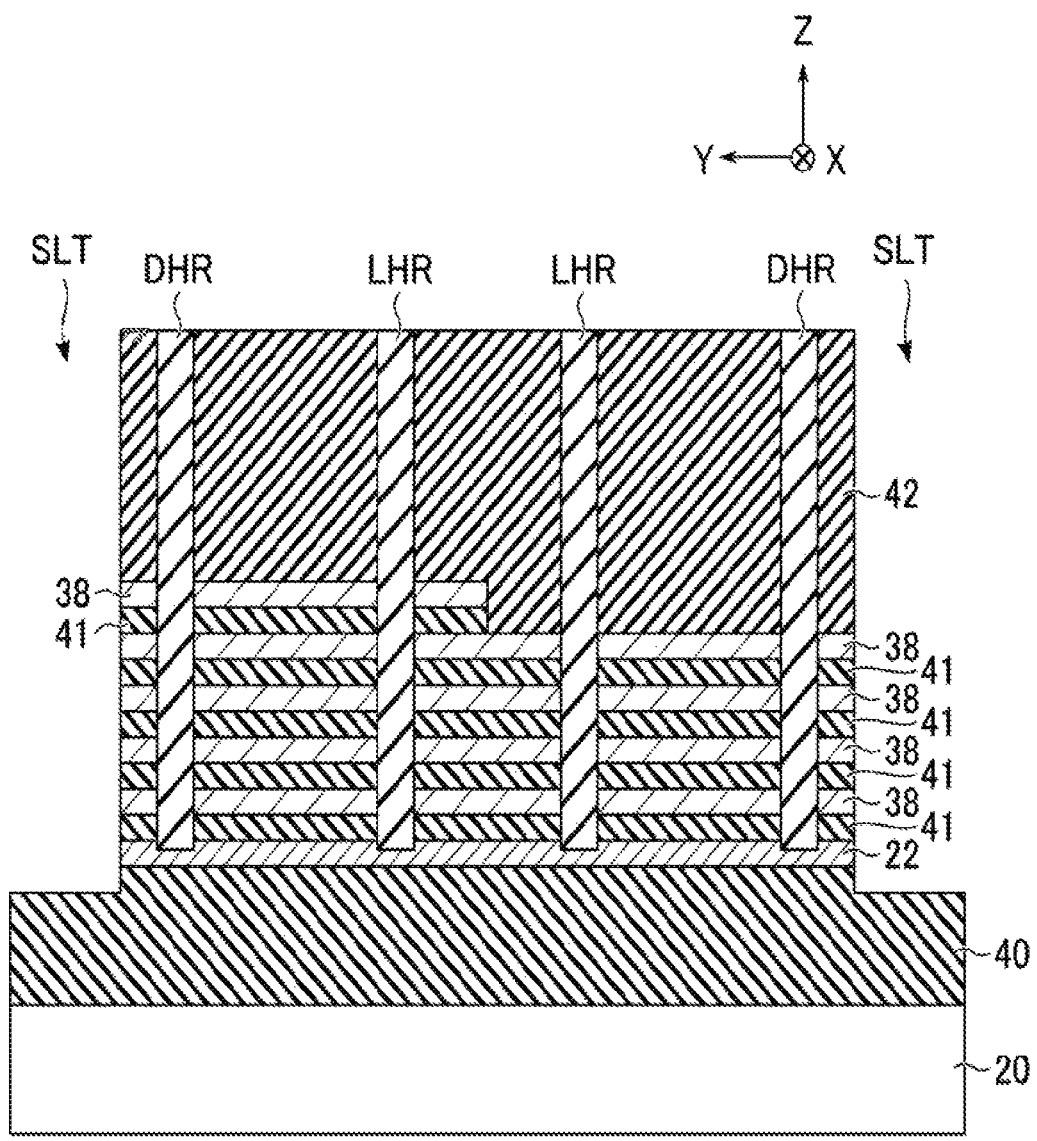
FIG. 11 is a cross-sectional view of the memory cell array illustrating an example of a process of manufacturing the semiconductor memory according to the embodiment.

Next, as illustrated in FIG. 11, the slits SLT are processed through lithography and anisotropic etching. The slits SLT are formed, for example, to reach the insulators 40 from the upper surface of the insulator 42.

Figure 12:
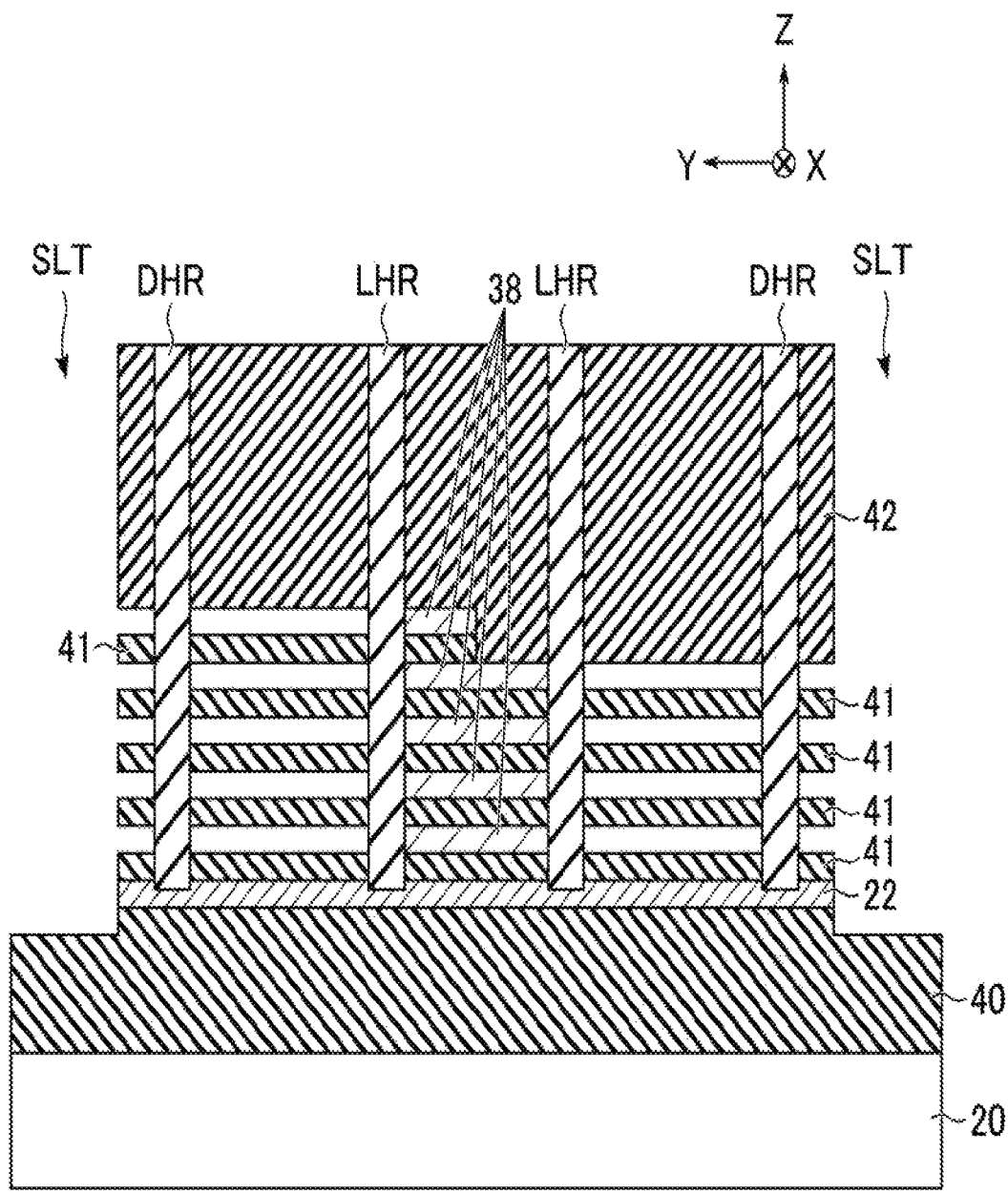
FIG. 12 is a cross-sectional view of the memory cell array illustrating an example of a process of manufacturing the semiconductor memory according to the embodiment.

Next, as illustrated in FIG. 12, the replacement materials 38 are removed by wet etching. Specifically, an etching solution having a high etching selectivity with respect to the replacement materials 38 is used for wet etching, and the replacement materials 38 are removed through the slits SLT.

At this time, in the area between the supporting column DHR and the supporting portion LHR, the replacement material 38 provided in each layer is dissolved by moving the etching solution from the perimeter of the supporting column DHR. On the other hand, since no etching solution enters the area between adjacent supporting portions LHR, the replacement material 38 does not dissolve and remains as it is.

The structure, from which the replacement material 38 has been removed, maintains a three-dimensional structure thereof by, for example, the supporting portions LHR, the supporting columns DHR, a stacked structure of the insulators 41 and the replacement materials 38 between adjacent supporting portions LHR, and the memory pillars MH formed in the area (not illustrated).

Figure 13:
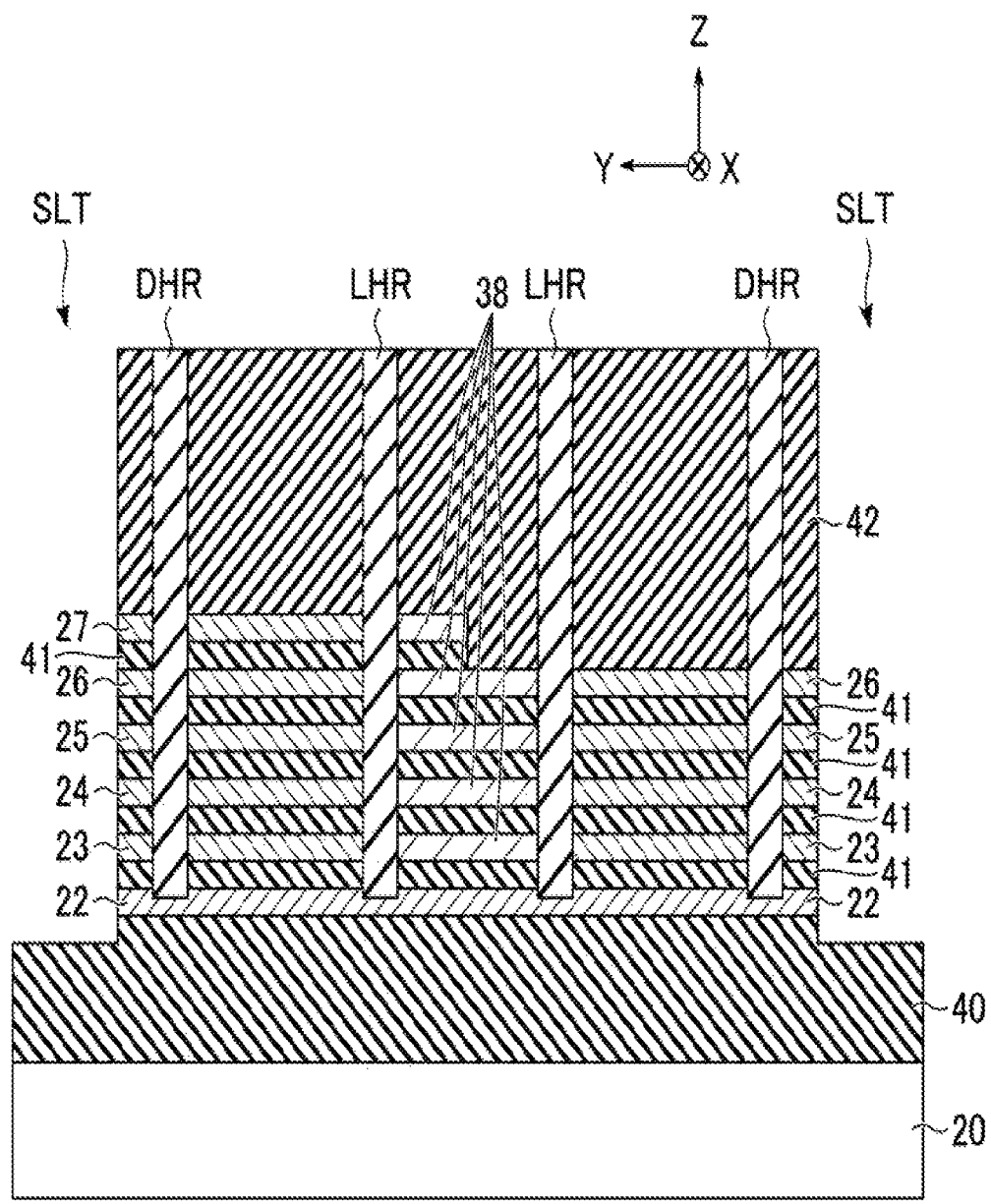
FIG. 13 is a cross-sectional view of the memory cell array illustrating an example of a process of manufacturing the semiconductor memory according to the embodiment.

Then, as illustrated in FIG. 13, a metal material, which functions as wires such as, for example, the word lines WL, is formed in the space from which the replacement material 38 has been removed. Then, the metal material, formed in the slits SLT or on the structure between the slits SLT, is removed by etching, so that the metal material provided in each layer is separated. As described above, the replacement material 38, which is different from the respective conductors 23 to 30, remains between respective adjacent insulators 41, among the plurality of insulators 41 that are stacked, between adjacent supporting portions LHR.

Through the manufacturing processes described above, the supporting portions LHR, the supporting columns DHR, and various wires are formed.

Figure 14:
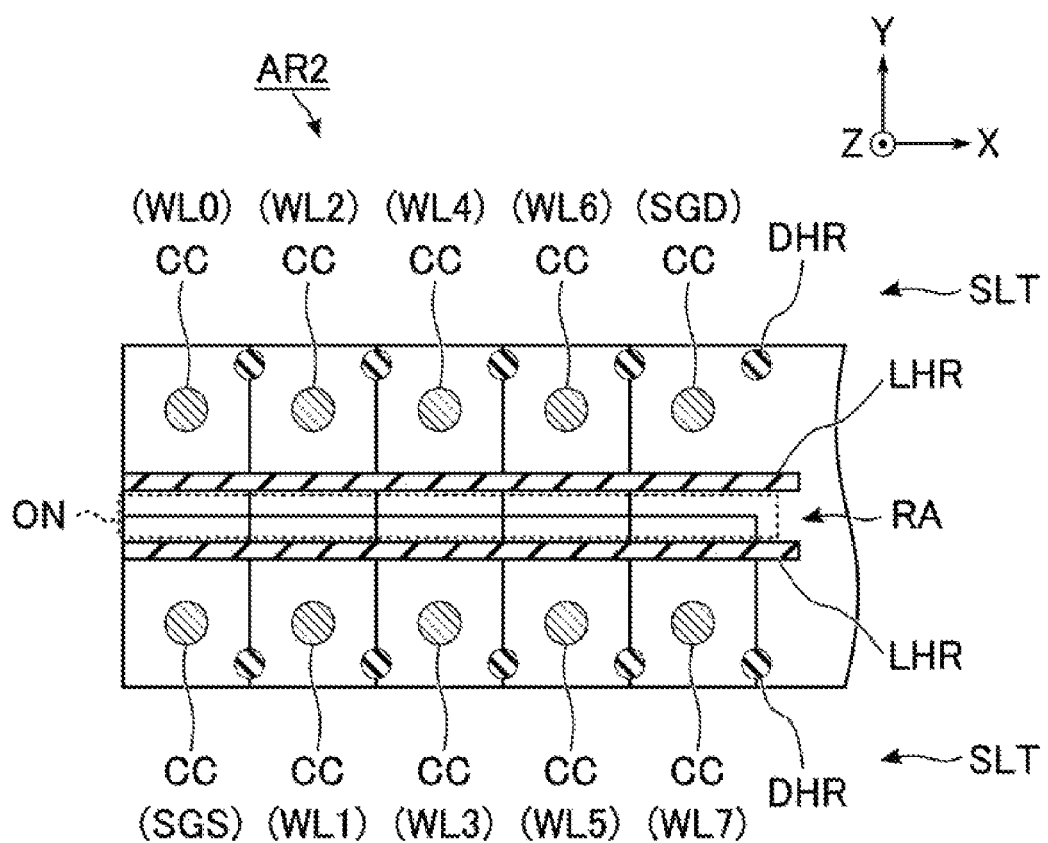
FIG. 14 is a plan view illustrating an example of a planar layout of the memory cell array provided in the semiconductor memory according to the embodiment.

FIG. 14 illustrates an example of an area in which a replacement processing is executed by the above manufacturing processes. As illustrated in FIG. 14, an oxide film-nitride film stack section ON is provided between two supporting portions LHR arranged in the Y direction. Then, in an end area RA on the memory pillar MH side between the two supporting portions LHR, a part of the replacement material 38 is removed and a metal material is formed. In this manner, the memory cell array 10 may include the metal material in the end area RA between the two supporting portions LHR.

[1-3] Effects

With the structure of the semiconductor memory 1 according to the embodiment described above, the yield of the semiconductor memory 1 may be improved. Hereinafter, detailed effects of the semiconductor memory 1 according to the embodiment will be described.

In a semiconductor memory in which memory cells are three-dimensionally stacked, wires such as, for example, the word lines WL are also stacked. As a process of manufacturing such a semiconductor memory, for example, a replacement processing may be performed in order to form conductors that function as wires such as, for example, the word lines WL.

The replacement processing includes a process of removing the replacement material 38, as described above with reference to FIGS. 12 and 13. At this time, a structure that functions as a memory cell array maintains a three-dimensional structure, which is formed by pre-formed memory pillars or supporting columns.

However, in the replacement processing, since the pressure is generated from the inside and the outside of the memory cell array, there is a possibility that a stepped portion of the conductors that function as the word lines WL bends or that the supporting columns of the stepped end portion are broken.

Therefore, in the semiconductor memory 1 according to the embodiment, two supporting portions LHR, designed in a line shape, are provided in a planar layout. Since no replacement material is removed between the two supporting portions LHR in the replacement processing, a stacked structure of an oxide film and a nitride film remains as it is.

That is, in the semiconductor memory 1 according to the embodiment, both the supporting portions LHR provided in a line shape and the oxide film-nitride film stack section ON between two adjacent supporting portions LHR function as columns that maintain a three-dimensional structure.

Thereby, in the semiconductor memory 1 according to the embodiment, it is possible to increase the area in a planar layout, over which the supporting portions LHR provided in a line shape, the supporting columns DHR provided in a dot shape, and the oxide film-nitride film stack section ON are provided in the stepped portion.

As a result, the semiconductor memory 1 according to the embodiment may increase the strength of columns used in the stepped portion for maintaining the three-dimensional structure thereof, thereby preventing the occurrence of defects due to the collapse of the three-dimensional structure thereof in the stepped portion. Therefore, the semiconductor memory 1 according to the embodiment may be improved in yield.

In addition, the semiconductor memory 1 according to the embodiment may be implemented by simply changing the design of the supporting columns and the supporting portions without changing the manufacturing process. That is, the semiconductor memory 1 according to the embodiment may prevent an increase in the manufacturing cost of the semiconductor memory 1.

[2] Modifications

The arrangement and structure of the supporting portions LHR and the supporting columns DHR in the memory cell array 10 described in the above embodiment are merely given by way of example, and various modifications thereof are conceivable. Hereinafter, respective modifications of the semiconductor memory 1 according to the embodiment will be described with respect to differences from the semiconductor memory 1 according to the embodiment.

[2-1] First Modification

Figure 15:
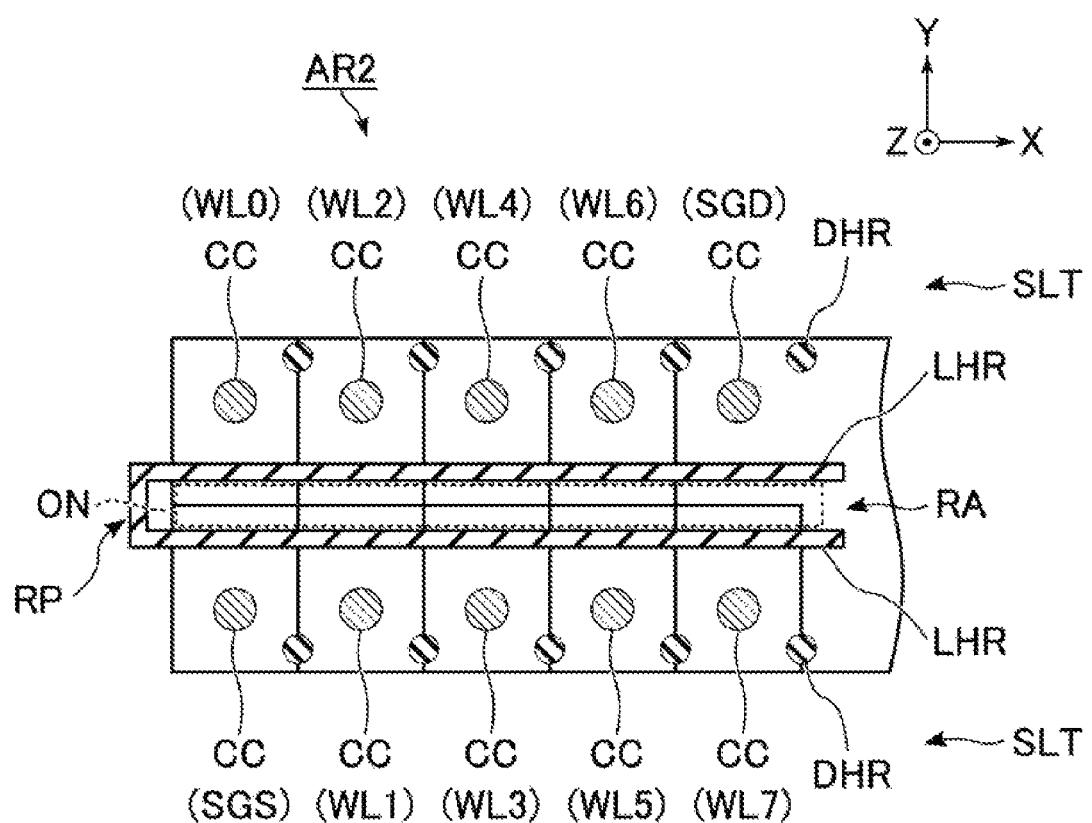
FIG. 15 is a plan view illustrating an example of a planar layout of the memory cell array provided in a semiconductor memory according to a first modification of the embodiment.

FIG. 15 illustrates an example of a planar layout of the memory cell array 10 provided in the semiconductor memory 1 according to a first modification of the embodiment. As illustrated in FIG. 15, in the memory cell array 10 according to the first modification, two supporting portions LHR, which are arranged in the structure between the slits SLT, extend to the outside of the structure.

Then, in a portion RP distant from the corresponding stacked structure, the end portions of the two supporting portions LHR are connected to each other. Even in such a case, as in the embodiment, the oxide film-nitride film stack section ON is formed between two adjacent supporting portions LHR.

As a result, as in the embodiment, the semiconductor memory 1 according to the first modification may prevent defects in the process of manufacturing the semiconductor memory 1, thereby improving the yield of the semiconductor memory 1.

[2-2] Second Modification

Figure 16:
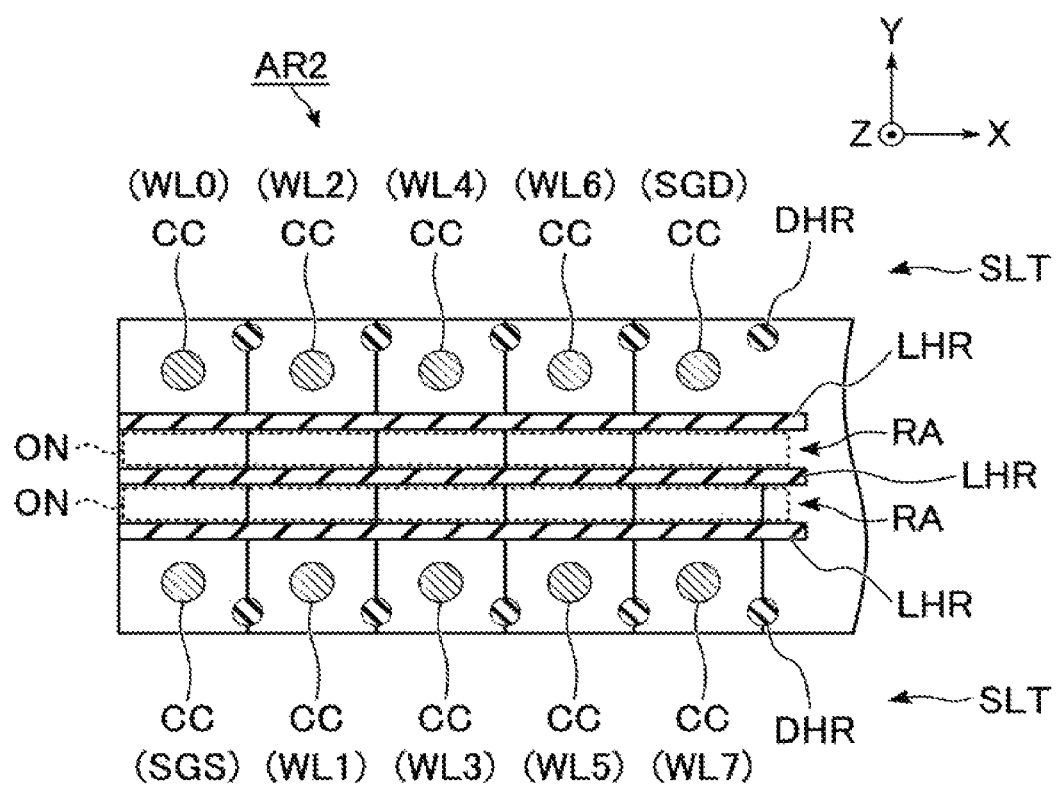
FIG. 16 is a plan view illustrating an example of a planar layout of the memory cell array provided in the semiconductor memory according to a second modification of the embodiment.

FIG. 16 illustrates an example of a planar layout of the memory cell array 10 provided in the semiconductor memory 1 according to a second modification of the embodiment. As illustrated in FIG. 16, in the memory cell array 10 according to the second modification, three supporting portions LHR are arranged in the Y direction in the structure between the slits SLT.

The end portions of the three supporting portions LHR in the X direction may or may not be aligned, as in the embodiment. No contact plug CC is disposed between adjacent supporting portions LHR, as in the embodiment. Even in such a case, as in the embodiment, the oxide film-nitride film stack section ON is formed between the adjacent supporting portions LHR.

As a result, as in the embodiment, the semiconductor memory 1 according to the second modification may prevent defects in the process of manufacturing the semiconductor memory 1, thereby improving the yield of the semiconductor memory 1.

[2-3] Third Modification

Figure 17:
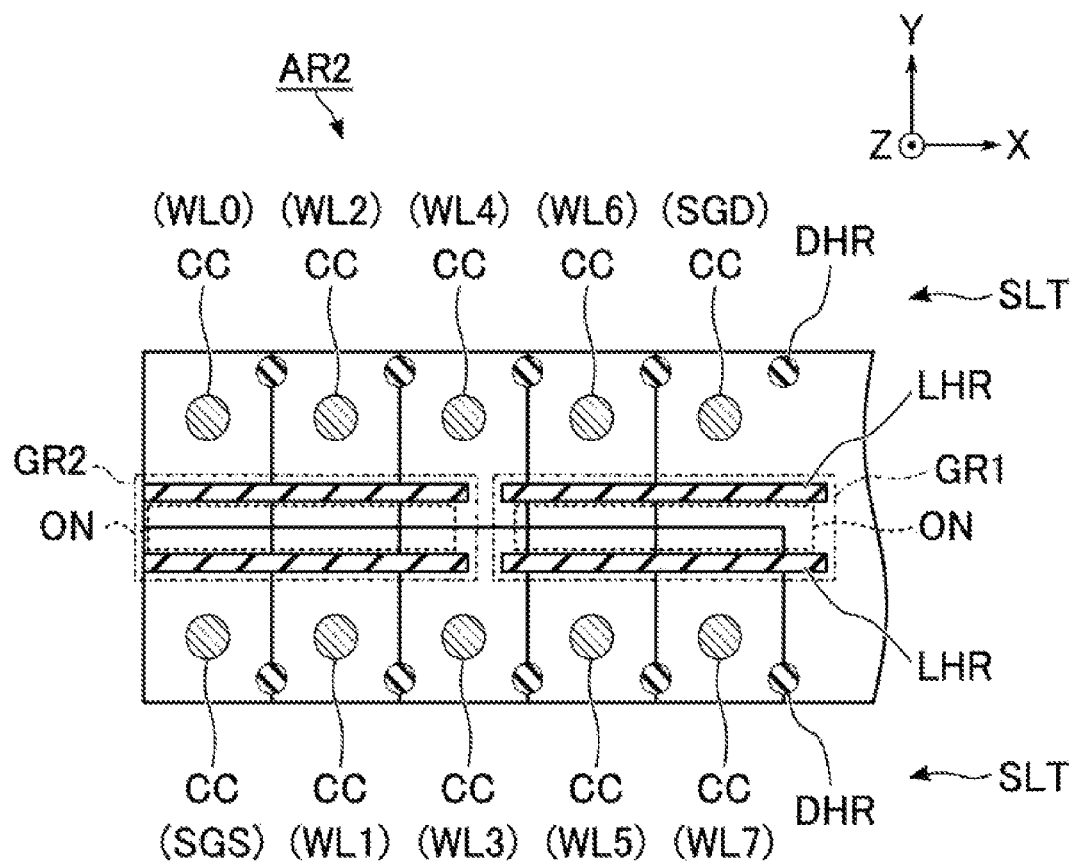
FIG. 17 is a plan view illustrating an example of a planar layout of the memory cell array provided in the semiconductor memory according to a third modification of the embodiment.

FIG. 17 illustrates an example of a planar layout of the memory cell array 10 provided in the semiconductor memory 1 according to a third modification of the embodiment. As illustrated in FIG. 17, in the memory cell array 10 according to the third modification, in the structure between the adjacent slits SLT, each of two supporting portions LHR arranged in the Y direction is divided into two in the X direction.

Specifically, groups GR1 and GR2, each including two supporting portions LHR, which extend in the X direction and are arranged in the Y direction, are provided in the structure between the slits SLT. In each group GR, the oxide film-nitride film stack section ON is formed between two adjacent supporting portions LHR, as in the embodiment. Conductors are formed by a replacement processing in the end portions of the supporting portions LHR in each group GR, but it is possible to reduce the area in which the conductors are formed between two adjacent supporting portions LHR by reducing the distance between the adjacent supporting portions LHR in each group GR.

As a result, as in the embodiment, the semiconductor memory 1 of the third modification may prevent defects in the process of manufacturing the semiconductor memory 1, thereby improving the yield of the semiconductor memory 1.

[2-4] Fourth Modification

Figure 18:
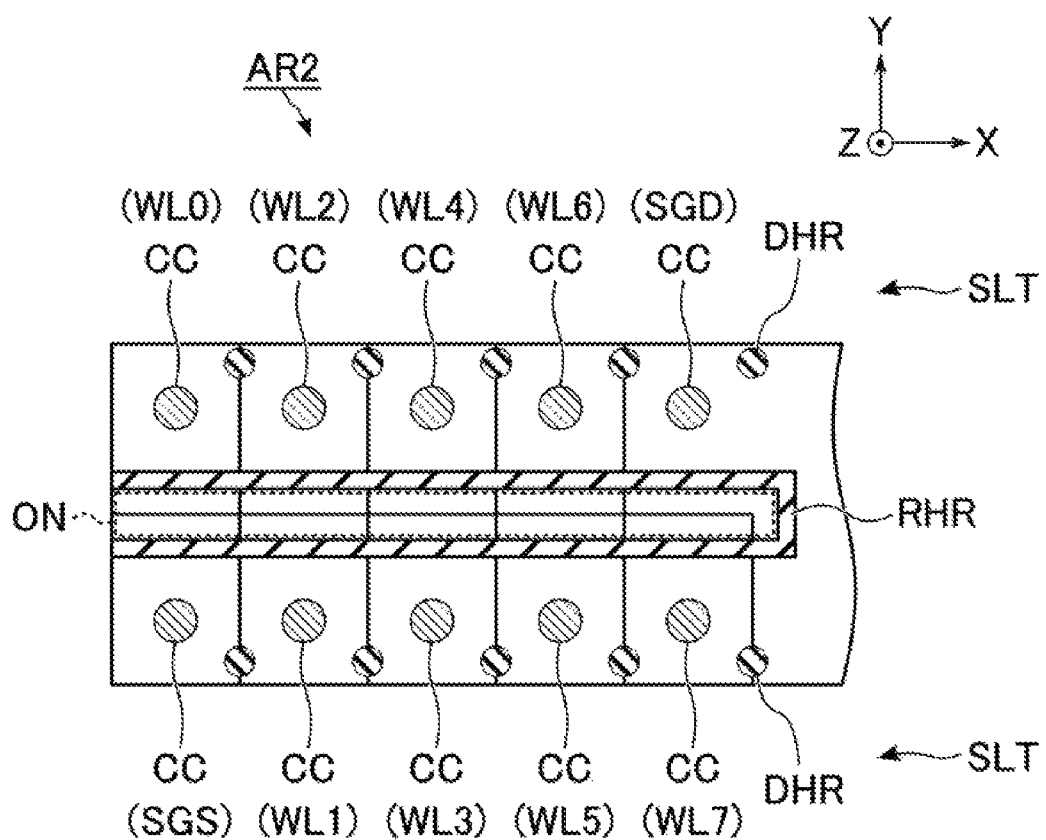
FIG. 18 is a plan view illustrating an example of a planar layout of the memory cell array provided in the semiconductor memory according to a fourth modification of the embodiment.

FIG. 18 illustrates an example of a planar layout of the memory cell array 10 provided in the semiconductor memory 1 according to a fourth modification of the embodiment. As illustrated in FIG. 18, in the memory cell array 10 according to the fourth modification, the end portions of two supporting portions LHR, which are arranged in the structure between the adjacent slits SLT, are connected to each other within the structure. Hereinafter, in the structure between the adjacent slits SLT, the supporting portion, which forms the area surrounding the structure, is referred to as a supporting portion RHR.

A structure of the supporting portion RHR is similar to that of the supporting portion LHR described in the embodiment. No contact plug CC is disposed in the area surrounded by the supporting portion RHR. Then, since the replacement material may not be removed through the slits SLT in a replacement processing in the area surrounded by the supporting portion RHR in the structure, the oxide film-nitride film stack section ON remains as it is.

As a result, as in the embodiment, the semiconductor memory 1 according to the fourth modification may prevent defects in the process of manufacturing the semiconductor memory 1, thereby improving the yield of the semiconductor memory 1.

[2-5] Fifth Modification

Figure 19:
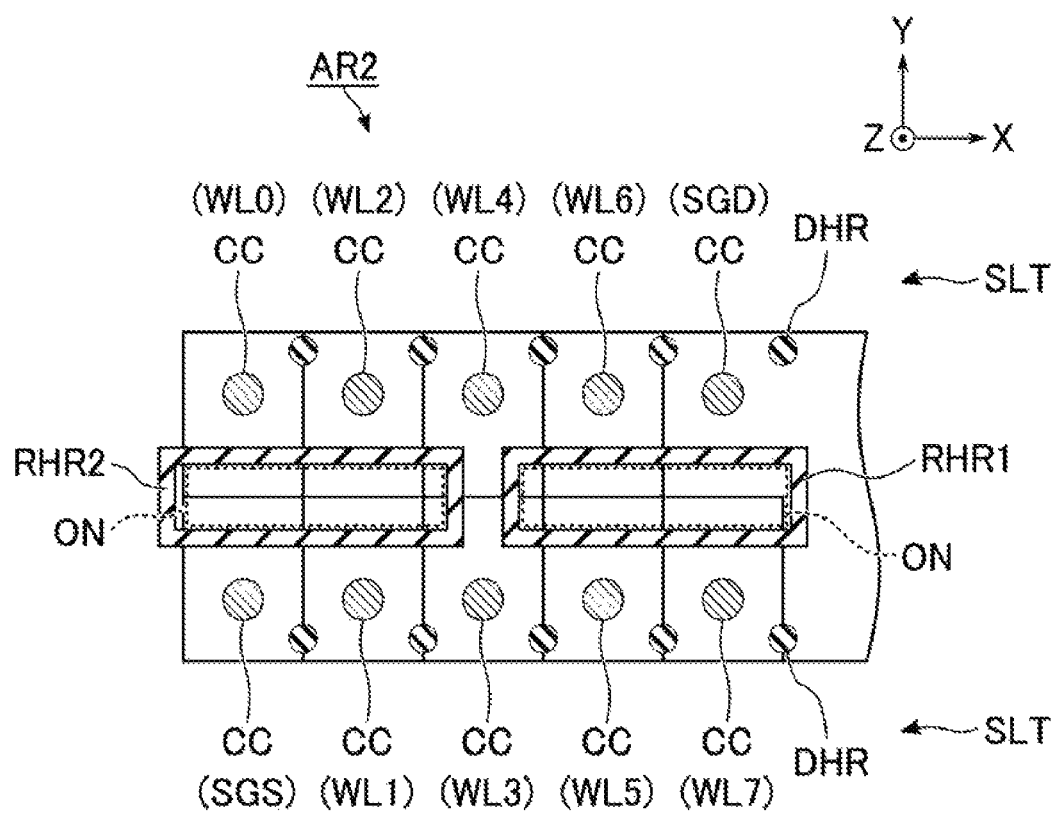
FIG. 19 is a plan view illustrating an example of a planar layout of the memory cell array provided in the semiconductor memory according to a fifth modification of the embodiment.

FIG. 19 illustrates an example of a planar layout of the memory cell array 10 provided in the semiconductor memory 1 according to a fifth modification of the embodiment. As illustrated in FIG. 19, in the memory cell array 10 according to the fifth modification, two supporting portions RHR1 and RHR2 are provided in the structure between the adjacent slits SLT.

The supporting portions RHR1 and RHR2 are arranged in the X direction within the structure between the adjacent slits SLT. The arrangement of the supporting portions RHR1 and RHR2 is not limited thereto, and may be displace in relation to each other in the Y direction, and the supporting portions RHR1 and RHR2 may have different sizes. Then, as in the fourth modification, the oxide film-nitride film stack section ON is formed in each of the respective areas surrounded by the supporting portions RHR1 and RHR2.

As a result, as in the embodiment, the semiconductor memory 1 according to the fifth modification may prevent defects in the process of manufacturing the semiconductor memory 1, thereby improving the yield of the semiconductor memory 1.

[2-6] Sixth Modification

Figure 20:
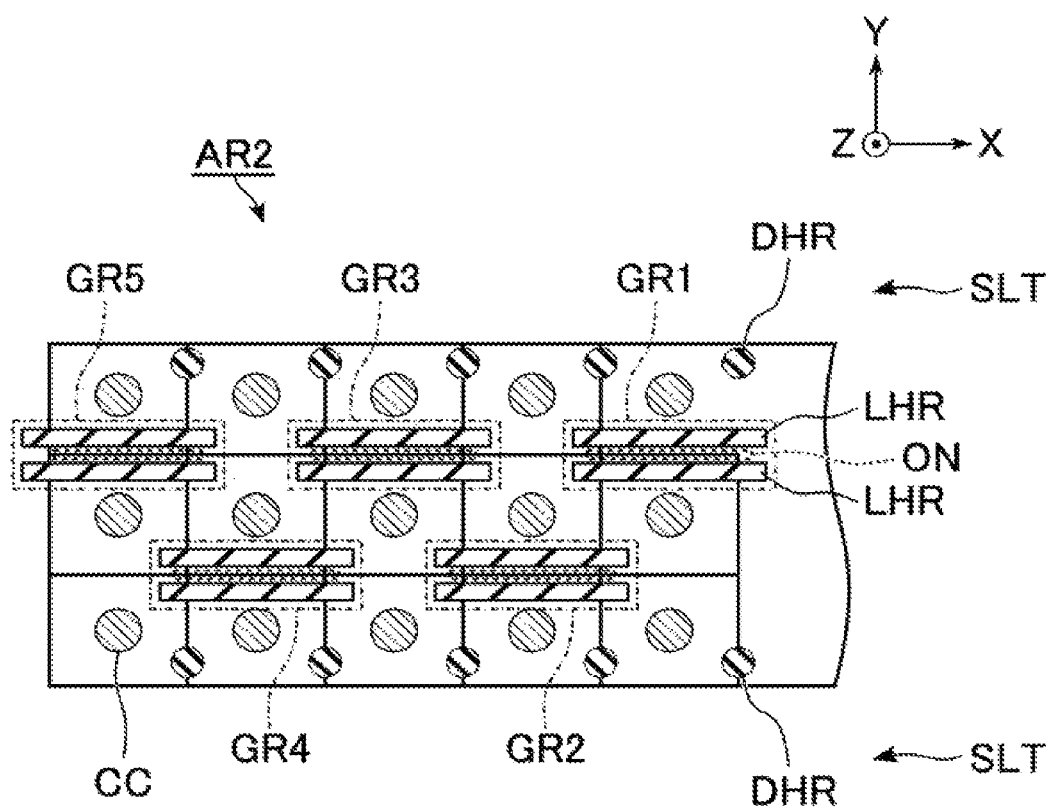
FIG. 20 is a plan view illustrating an example of a planar layout of the memory cell array provided in the semiconductor memory according to a sixth modification of the embodiment.

FIG. 20 illustrates an example of a planar layout of the memory cell array 10 provided in the semiconductor memory 1 according to a sixth modification of the embodiment. As illustrated in FIG. 20, in the memory cell array 10 according to the sixth modification, the structure between the adjacent slits SLT is formed in the shape of three rows of steps, and a plurality of groups, each including two supporting portions LHR provided in parallel, are provided.

Specifically, groups GR1 to GR5, each including two supporting portions LHR, which extend in the X direction and are arranged in the Y direction, are provided in the structure between the adjacent slits SLT. The groups GR1 to GR5 are arranged, for example, in a staggered manner, and each group GR is disposed, for example, in a stepped portion of conductors formed in the shape of steps. The number and arrangement of groups GR are not limited thereto as long as the conductors, which correspond to the central portion of three rows of steps, may be formed by the replacement processing.

Then, in each group GR, the oxide film-nitride film stack section ON is formed between two adjacent supporting portions LHR, as in the embodiment. In the sixth modification, as in the third modification, it is possible to reduce the area in which the conductors are formed in the end portions of two adjacent supporting portions LHR by reducing the distance between the supporting portions LHR in each group GR.

As a result, as in the embodiment, the semiconductor memory 1 according to the sixth modification may prevent defects in the process of manufacturing the semiconductor memory 1, thereby improving the yield of the semiconductor memory 1.

[2-7] Seventh Modification

Figure 21:
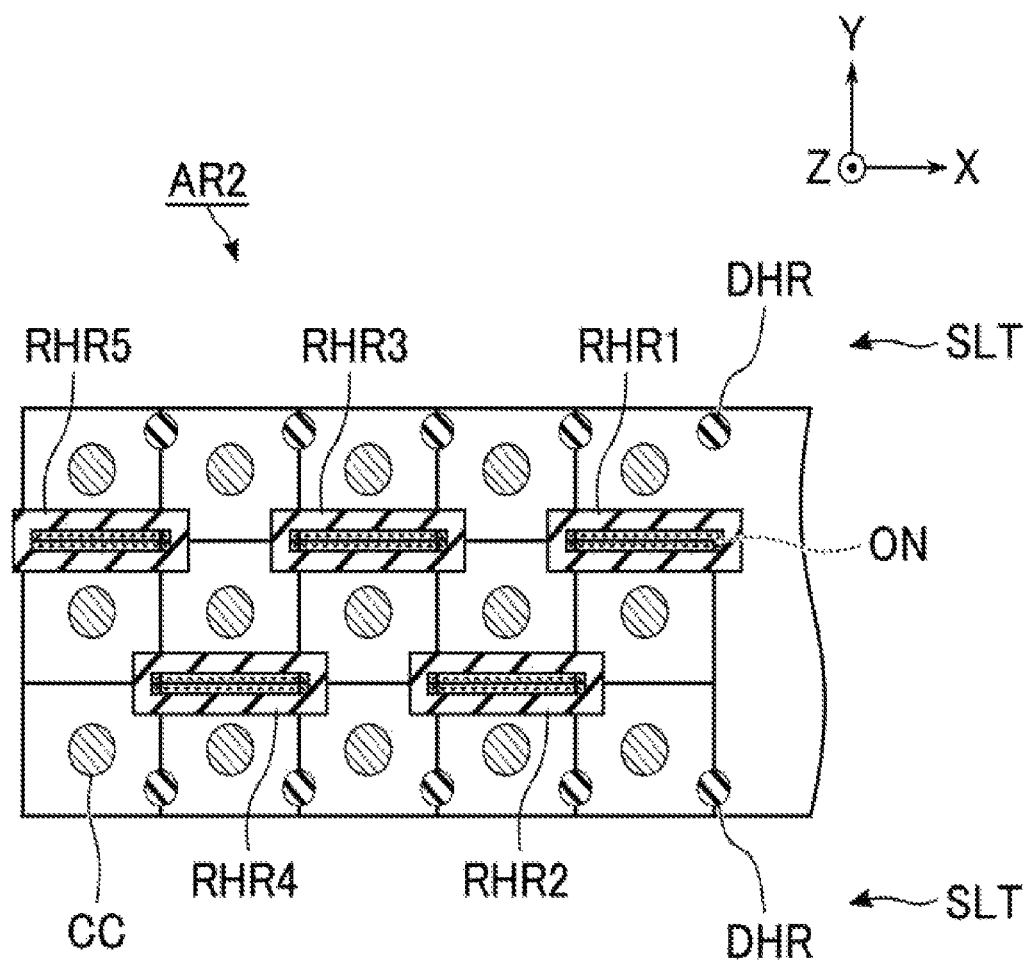
FIG. 21 is a plan view illustrating an example of a planar layout of the memory cell array provided in the semiconductor memory according to a seventh modification of the embodiment.

FIG. 21 illustrates an example of a planar layout of the memory cell array 10 provided in the semiconductor memory 1 according to a seventh modification of the embodiment. As illustrated in FIG. 21, in the memory cell array 10 according to the seventh modification, the structure between the adjacent slits SLT is formed in the shape of three rows of steps, and is provided with a plurality of supporting portions RHR.

Specifically, for example, supporting portions RHR1 to RHR5 are provided in the structure between the slits SLT. The supporting portions RHR1 to RHR5 are arranged, for example, in a staggered manner, and each supporting portion RHR is disposed, for example, in a stepped portion of conductors formed in the shape of steps. The number and arrangement of supporting portions RHR are not limited thereto as long as the conductors, which correspond to the central portion of three rows of steps, can be formed by a replacement processing. Then, the oxide film-nitride film stack section ON is formed in the area surrounded by each supporting portion RHR.

As a result, as in the embodiment, the semiconductor memory 1 according to the seventh modification may prevent defects in the process of manufacturing the semiconductor memory 1, thereby improving the yield of the semiconductor memory 1.

[2-8] Eighth Modification

Figure 22:
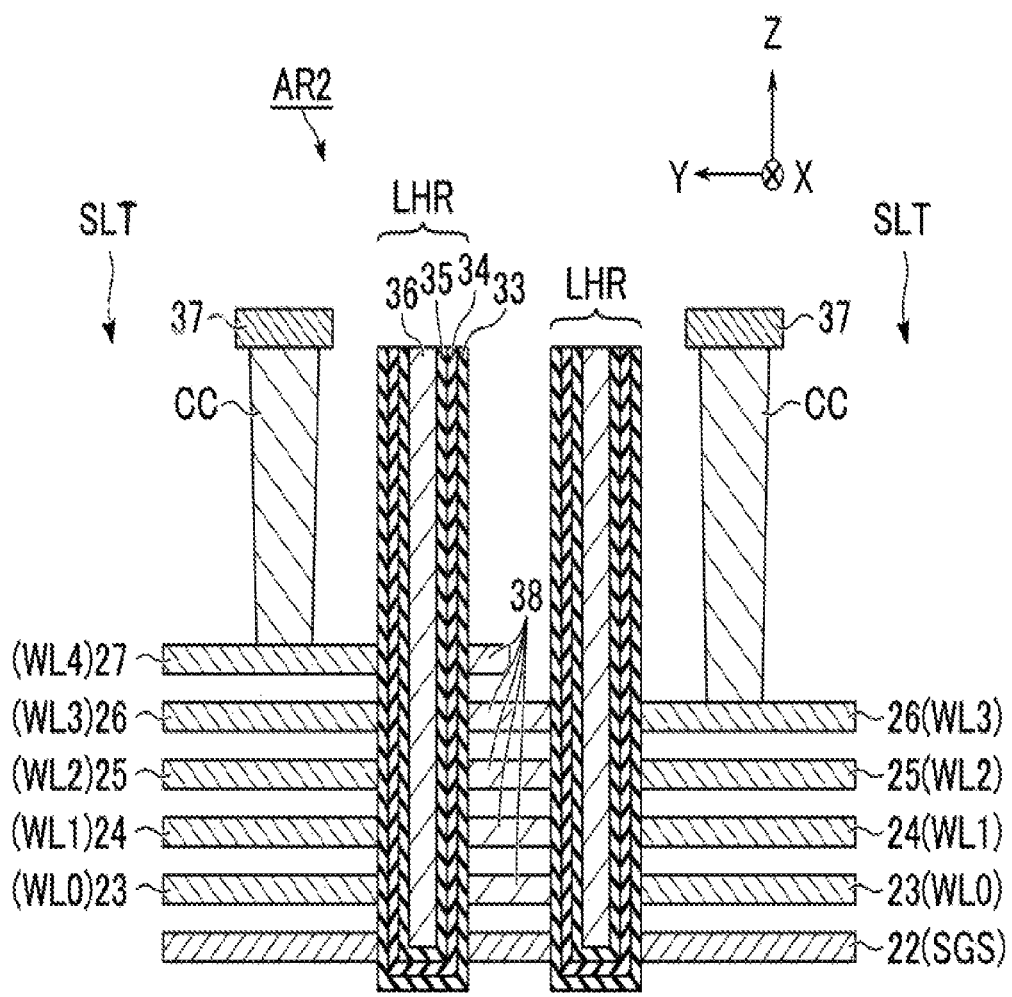
FIG. 22 is a cross-sectional view illustrating an example of a cross-section structure of the memory cell array provided in the semiconductor memory according to an eighth modification of the embodiment.

FIG. 22 illustrates an example of a cross-sectional structure of the memory cell array provided in the semiconductor memory 1 according to an eighth modification of the embodiment. As illustrated in FIG. 22, in the memory cell array 10 of the eighth modification, the supporting portion LHR has a different structure.

Specifically, for example, as illustrated in FIG. 22, the supporting portion LHR includes the block insulating film 33, the insulating film 34, the tunnel oxide film 35, and the conductive semiconductor material 36. The block insulating film 33 is provided on the inner wall of the slit, which forms the supporting portion LHR. The insulating film 34 is provided on the inner wall of the block insulating film 33. The tunnel oxide film 35 is provided on the inner wall of the insulating film 34. The semiconductor material 36 is provided on the inner wall of the tunnel oxide film 35. Different materials may be formed on the inner wall of the semiconductor material 36.

That is, a supporting column of the eighth modification has the same layer structure as that of the memory pillar MH. The reason why such a layer structure is formed is because the layer structure in the memory pillar MH and the layer structure in the supporting portion LHR may be simultaneously formed depending on the process of manufacturing the semiconductor memory 1.

As described above, even when the layer structure of the supporting portion LHR has the same layer structure as that of the memory pillar MH, as in the embodiment, the semiconductor memory 1 according to the modification may prevent defects in the process of manufacturing the semiconductor memory 1, thereby improving the yield of the semiconductor memory 1.

In addition, the supporting portion LHR is used as an example in the above description, but the supporting column DHR and the supporting portion RHR may have the same structure as that of the supporting portion LHR. In addition, it is also conceivable that the supporting portion LHR is buried in the course of forming the layer structure in the memory pillar MH depending on the planar size of the supporting portion LHR. That is, each supporting portion LHR may include only a part of components of the memory pillar MH.

[3] Others

The semiconductor memory (e.g., 1 in FIG. 1) of the embodiment includes a stack section, a plurality of contact plugs (e.g., CC in FIG. 3), first and second supporting portions (e.g., LHR in FIG. 3), and a first material. The stack section is formed by alternately stacking a first conductor (e.g., 23 to 30 in FIG. 4) and a first insulator (e.g., 41 in FIG. 13) in a first direction (e.g., the Z direction in FIG. 3), and includes a first area (e.g., AR1 in FIG. 3) including a memory cell and a second area (e.g., AR2 in FIG. 3) including respective end portions of a plurality of first conductors and a plurality of first insulators that are stacked. The plurality of contact plugs respectively reach the first conductors in the second area. The first and second supporting portions respectively pass through the stack section in the first direction, and are arranged in a second direction (e.g., the Y direction in FIG. 3), which crosses the first direction, in the second area. The first material (e.g., 38 in FIG. 13) is provided between respective adjacent first insulators, among the plurality of first insulators that are stacked, between the first supporting portion and the second supporting portion, and is different from the first conductors. Thereby, the semiconductor memory 1 may be improved in yield.

The configurations of the supporting column described in the embodiment and the respective modifications may be appropriately combined. For example, the memory cell array 10 may have a structure in which the supporting column DHR, the supporting portion LHR, and the supporting portion RHR are combined.

The manufacturing process described in the above embodiment is merely given by way of example, and other processes may be inserted between the respective manufacturing processes, or the order of each processing may be changed as much as possible.

In the above embodiment, the configuration of the memory cell array 10 may have any other configuration. For example, the number of string units SU in each block BLK may be designed in any number. In addition, each of the memory cell transistors MT and the select transistors ST1 and ST2 in each NAND string NS may be designed in any number.

In addition, the numbers of word lines WL and select gate lines SGD and SGS are changed respectively based on the numbers of memory cell transistors MT and select transistors ST1 and ST2. A plurality of conductors 22 provided respectively in a plurality of layers may be allocated to the select gate line SGS, and a plurality of conductors 31 provided respectively in a plurality of layers may be allocated to the select gate line SGD.

In addition, in the above embodiment, a case where the memory pillar MH is formed in a single-stage structure has been described by way of example, but the disclosure is not limited thereto. The memory pillar MH may have a structure in which two or more stages of pillars having the same structure are connected in the Z direction.

In addition, in the above embodiment, a case where the end portions of the conductors, which correspond to the word lines WL0 to WL7 and the select gate lines SGS and SGD, are provided in the shape of two rows or three rows of steps in the lead-out area AR2 of the memory cell array 10 has been described by way of example, but the disclosure is not limited thereto. For example, the end portions of the conductors may be provided in the shape of a single row of step or four or more rows of steps. Even in such a case, the semiconductor memory 1 may obtain the same effects as in the above embodiment by appropriately combining the supporting portion LHR, the supporting column DHR, and the supporting portion RHR described in the above embodiment.

In addition, in the above embodiment, a case where each of the memory pillars MH and the slits SLT is formed up to the surface of the conductor 21 has been described by way of example, but the disclosure is not limited thereto. For example, over-etching may be performed when forming these holes and the slits SLT, and the bottom surface of the memory pillar MH and the bottom surface of the slit SLT may be formed in the conductor 21. In addition, the memory pillar MH may pass through the conductor 21. In this case, the conductor 21 passes through each of the block insulating film 33, the insulating film 34, and the tunnel oxide film 35, and is connected to the semiconductor material 36 from the side surface of the memory pillar MH.

In addition, in the above embodiment, a case where the conductor 21 is provided only in the cell area AR1 has been described by way of example, but the disclosure is not limited thereto. For example, the conductor 21 may extend from the cell area AR1 to the lead-out area AR2.

Other configurations of the memory cell array 10 are described, for example, in U.S. patent application Ser. No. 12/407,403 filed on Mar. 19, 2009 entitled "Three-dimensional Stacked Nonvolatile Semiconductor Memory," U.S. patent application Ser. No. 14/406,524, filed on Mar. 18, 2009 entitled "Three-dimensional Stacked Nonvolatile Semiconductor memory," U.S. patent application Ser. No. 12/679,991 filed on Mar. 25, 2010 entitled "Nonvolatile Semiconductor Storage Device and Manufacturing Method thereof," and U.S. patent application Ser. No. 14/532,030 filed on Mar. 23, 2009 entitled "Semiconductor Memory and Manufacturing Method thereof," respectively. The entirety of these patent applications is incorporated herein by reference.

In the present specification, the term "connection" means that two are electrically connected to each other, and does not exclude, for example, that another element is interposed between the two.

While certain embodiments have been described, these embodiments have been presented by way of an example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
    a stack comprising a first region and a second region different from the first region, the first region including a plurality of first conductors and a plurality of first insulators alternately stacked in a first direction;
    a first insulator portion and a second insulator portion respectively extending within the second region in the first direction and a second direction crossing the first direction, the first and second insulating portions being arranged in a third direction crossing the first and second directions; and
    a plurality of layers provided between the first insulator portion and the second insulator portion, each of the plurality of layers being between adjacent two of the plurality of first insulators, a material of the plurality of layers being different from a material of the plurality of first conductors.

2. The semiconductor memory according to claim 1, further comprising:
    a plurality of support pillars respectively extending in the first direction within the second region.

3. The semiconductor memory according to claim 1, further comprising:
    a first layer and a second layer respectively extending in the first and second directions within the first and second regions, the first and second layers being arranged in the third direction.

4. The semiconductor memory according to claim 1, wherein the first and second insulator portions are connected to each other.

5. The semiconductor memory according to claim 1, wherein the first and second insulator portions are separated from each other.

6. The semiconductor memory according to claim 1, wherein each of the plurality of first conductors includes tungsten.

7. The semiconductor memory according to claim 6, wherein each of the plurality of first conductors is made of tungsten.

8. The semiconductor memory according to claim 1, wherein the material of the plurality of layers includes silicon and nitrogen.

9. The semiconductor memory according to claim 8, wherein the material of the plurality of layers is silicon nitride.

10. The semiconductor memory according to claim 1, wherein each of the first and second insulator portions is in a plate shape along a plane defined in the first direction and third directions.

11. The semiconductor memory according to claim 1, further comprising:
    a plurality of contact plugs extending in the first direction within the second region, each of the plurality of contact plugs being electrically connected to one of plurality of first conductors.

12. The semiconductor memory according to claim 1, further comprising:
    a third insulator portion extending within the second region in the first and second directions, the first, third, and third insulating portions being arranged in the third direction in order.

* * * * *